United States Patent
Dacha et al.

(10) Patent No.: US 11,095,365 B2
(45) Date of Patent: Aug. 17, 2021

(54) WIDE-ANGLE ILLUMINATOR MODULE

(71) Applicant: Lumentum Operations LLC, San Jose, CA (US)

(72) Inventors: Preethi Dacha, Albuquerque, NM (US); David Podva, Albuquerque, NM (US); Mial E. Warren, Albuquerque, NM (US)

(73) Assignee: Lumentum Operations LLC, San Jose, CA (US)

(*) Notice: Subject to any disclaimer, the term of this patent is extended or adjusted under 35 U.S.C. 154(b) by 25 days.

(21) Appl. No.: 16/406,846

(22) Filed: May 8, 2019

(65) Prior Publication Data

US 2019/0268068 A1 Aug. 29, 2019

Related U.S. Application Data

(60) Continuation-in-part of application No. 14/946,730, filed on Nov. 19, 2015, now Pat. No. 10,615,871.
(Continued)

(51) Int. Cl.
*H04B 10/11* (2013.01)
*H04B 10/50* (2013.01)
(Continued)

(52) U.S. Cl.
CPC ........... *H04B 10/11* (2013.01); *G02B 5/02* (2013.01); *G02B 5/32* (2013.01); *G02B 27/0905* (2013.01);
(Continued)

(58) Field of Classification Search
None
See application file for complete search history.

(56) References Cited

U.S. PATENT DOCUMENTS

| 3,805,255 A | 4/1974 | Baker |
| 4,119,948 A | 10/1978 | Ward et al. |

(Continued)

FOREIGN PATENT DOCUMENTS

| CN | 1449130 A | 10/2003 |
| CN | 200976052 Y | 11/2007 |

(Continued)

OTHER PUBLICATIONS

Warren et al, "Integration of Diffractive Lenses with Addressable Vertical-Cavity Laser Arrays", Sandia National Laboratories, Albuquerque, NM 87185, Conf-950226-38, Sand95-0360C.

(Continued)

*Primary Examiner* — David W Lambert
(74) *Attorney, Agent, or Firm* — Harrity & Harrity, LLP

(57) ABSTRACT

A wide-angle illuminator module including a rigid support structure having a plurality of angled faces, a flexible circuit including one or more VCSEL arrays, each VCSEL array positioned over a face among the plurality of angled faces, each VCSEL array including a plurality of integrated microlenses with one microlens positioned over each VCSEL in the VCSEL array, and a driver circuit for providing electrical pulses to each VCSEL array, wherein the plurality of VCSEL arrays address illumination zones in a combined field of illumination. The support structure may also be a heatsink. The flexible circuit may be a single flexible circuit configured to be placed over the support structure or a plurality of flexible circuits, each including one VCSEL array.

20 Claims, 19 Drawing Sheets

Related U.S. Application Data which is a division of application No. 13/594,714, filed on Aug. 24, 2012, now abandoned.

(60) Provisional application No. 62/668,750, filed on May 8, 2018, provisional application No. 61/671,036, filed on Jul. 12, 2012, provisional application No. 61/528,119, filed on Aug. 26, 2011.

(51) Int. Cl.

| | |
|---|---|
| G02B 27/09 | (2006.01) |
| G02B 5/32 | (2006.01) |
| H01S 5/00 | (2006.01) |
| G02B 5/02 | (2006.01) |
| H01S 5/42 | (2006.01) |
| G02B 27/10 | (2006.01) |
| H01S 5/02325 | (2021.01) |
| H01S 5/50 | (2006.01) |
| H01S 5/062 | (2006.01) |
| H01S 5/02345 | (2021.01) |

(52) U.S. Cl.
CPC ......... *G02B 27/0944* (2013.01); *G02B 27/10* (2013.01); *H01S 5/005* (2013.01); *H01S 5/02325* (2021.01); *H01S 5/423* (2013.01); *H04B 10/503* (2013.01); *H01S 5/02345* (2021.01); *H01S 5/06226* (2013.01); *H01S 5/50* (2013.01)

(56) References Cited

U.S. PATENT DOCUMENTS

| | | |
|---|---|---|
| 4,127,322 A | 11/1978 | Jacobson et al. |
| 4,447,136 A | 5/1984 | Kitamura |
| 4,448,491 A | 5/1984 | Okubo |
| 4,714,314 A | 12/1987 | Yang et al. |
| 4,822,755 A | 4/1989 | Hawkins et al. |
| 4,827,482 A | 5/1989 | Towe et al. |
| 4,850,685 A | 7/1989 | Kamakura et al. |
| 4,870,652 A | 9/1989 | Thornton |
| 4,881,237 A | 11/1989 | Donnelly |
| 4,971,927 A | 11/1990 | Leas |
| 5,034,344 A | 7/1991 | Jewell et al. |
| 5,060,304 A | 10/1991 | Solinsky |
| 5,070,399 A | 12/1991 | Martel |
| 5,073,041 A | 12/1991 | Rastani |
| 5,098,183 A | 3/1992 | Sonehara |
| 5,164,949 A | 11/1992 | Ackley et al. |
| 5,258,316 A | 11/1993 | Ackley et al. |
| 5,317,170 A * | 5/1994 | Paoli .......................... B41J 2/45 257/88 |
| 5,325,385 A | 6/1994 | Kasukawa et al. |
| 5,325,386 A | 6/1994 | Jewell et al. |
| 5,328,854 A | 7/1994 | Vakhshoori et al. |
| 5,359,618 A | 10/1994 | Lebby et al. |
| 5,383,200 A | 1/1995 | Barrett et al. |
| 5,402,436 A | 3/1995 | Paoli |
| 5,420,879 A | 5/1995 | Kawarada et al. |
| 5,422,753 A | 6/1995 | Harris |
| 5,422,903 A | 6/1995 | Yamada et al. |
| 5,457,561 A | 10/1995 | Taneya et al. |
| 5,504,767 A | 4/1996 | Jamison et al. |
| 5,557,115 A | 9/1996 | Shakuda |
| 5,574,738 A | 11/1996 | Morgan |
| 5,581,571 A | 12/1996 | Holonyak, Jr. et al. |
| 5,640,188 A | 6/1997 | Andrews |
| 5,680,241 A | 10/1997 | Sakanaka et al. |
| 5,707,139 A | 1/1998 | Haitz |
| 5,745,515 A | 4/1998 | Mart et al. |
| 5,758,951 A | 6/1998 | Haitz |
| 5,781,671 A | 7/1998 | Li et al. |
| 5,801,666 A | 9/1998 | MacFarlane |
| 5,812,571 A | 9/1998 | Peters et al. |
| 5,825,803 A | 10/1998 | Labranche et al. |
| 5,896,408 A | 4/1999 | Corzine et al. |
| 5,918,108 A | 6/1999 | Peters |
| 5,930,279 A | 7/1999 | Apollonov et al. |
| 5,976,905 A | 11/1999 | Cockerill et al. |
| 5,991,318 A | 11/1999 | Caprara et al. |
| 6,007,218 A | 12/1999 | German et al. |
| 6,044,101 A | 3/2000 | Luft |
| 6,075,650 A | 6/2000 | Morris et al. |
| 6,075,804 A | 6/2000 | Deppe et al. |
| 6,125,598 A | 10/2000 | Lanphier |
| 6,128,131 A | 10/2000 | Tang |
| 6,136,623 A | 10/2000 | Hofstetter et al. |
| 6,154,480 A | 11/2000 | Magnusson et al. |
| 6,167,068 A | 12/2000 | Caprara et al. |
| 6,215,598 B1 | 4/2001 | Hwu |
| 6,259,715 B1 | 7/2001 | Nakayama |
| 6,353,502 B1 | 3/2002 | Marchant et al. |
| 6,393,038 B1 | 5/2002 | Raymond et al. |
| 6,446,708 B1 | 9/2002 | Lai |
| 6,493,368 B1 | 12/2002 | Chirovsky et al. |
| 6,608,849 B2 | 8/2003 | Mawst et al. |
| 6,650,451 B1 * | 11/2003 | Byers .................. H04B 10/1125 398/129 |
| 6,661,820 B1 | 12/2003 | Camilleri et al. |
| 6,728,289 B1 | 4/2004 | Peak et al. |
| 6,757,314 B2 | 6/2004 | Kneissl et al. |
| 6,775,308 B2 | 8/2004 | Hamster et al. |
| 6,775,480 B1 | 8/2004 | Goodwill |
| 6,898,222 B2 | 5/2005 | Hennig et al. |
| 6,922,430 B2 | 7/2005 | Biswas et al. |
| 6,943,875 B2 | 9/2005 | DeFelice et al. |
| 6,947,459 B2 | 9/2005 | Kurtz et al. |
| 6,959,025 B2 | 10/2005 | Jikutani et al. |
| 6,974,373 B2 | 12/2005 | Kriesel |
| 7,016,381 B2 | 3/2006 | Husain et al. |
| 7,087,886 B2 | 8/2006 | Almi et al. |
| 7,126,974 B1 | 10/2006 | Dong et al. |
| 7,232,240 B2 | 6/2007 | Kosnik et al. |
| 7,257,141 B2 | 8/2007 | Chua |
| 7,262,758 B2 | 8/2007 | Kahen et al. |
| 7,315,560 B2 | 1/2008 | Lewis et al. |
| 7,357,513 B2 | 4/2008 | Watson et al. |
| 7,359,420 B2 | 4/2008 | Shchegrov et al. |
| 7,385,229 B2 | 6/2008 | Venugopalan |
| 7,386,025 B2 | 6/2008 | Omori et al. |
| 7,388,893 B2 | 6/2008 | Watanabe et al. |
| 7,430,231 B2 | 9/2008 | Luo et al. |
| 7,471,854 B2 | 12/2008 | Cho et al. |
| 7,568,802 B2 | 8/2009 | Phinney et al. |
| 7,613,215 B2 | 11/2009 | Kim |
| 7,680,168 B2 | 3/2010 | Uchida |
| 7,688,525 B2 | 3/2010 | Hines et al. |
| 7,742,640 B1 | 6/2010 | Carlson et al. |
| 7,751,716 B2 | 7/2010 | Killinger |
| 7,787,767 B2 | 8/2010 | Wang |
| 7,796,081 B2 | 9/2010 | Breed |
| 7,834,302 B2 | 11/2010 | Ripingill et al. |
| 7,911,412 B2 | 3/2011 | Benner |
| 7,925,059 B2 | 4/2011 | Hoyos et al. |
| 7,949,024 B2 | 5/2011 | Joseph |
| 7,970,279 B2 | 6/2011 | Dress |
| 8,995,485 B2 | 3/2015 | Joseph et al. |
| 8,995,493 B2 | 3/2015 | Joseph et al. |
| 9,746,369 B2 | 8/2017 | Shpunt et al. |
| 2001/0038596 A1 | 11/2001 | Xu et al. |
| 2001/0040714 A1 | 11/2001 | Sundaram et al. |
| 2001/0043381 A1 | 11/2001 | Green et al. |
| 2002/0034014 A1 | 3/2002 | Gretton et al. |
| 2002/0041562 A1 | 4/2002 | Redmond et al. |
| 2002/0129723 A1 | 9/2002 | Beier et al. |
| 2002/0141011 A1 | 10/2002 | Green et al. |
| 2002/0141902 A1 | 10/2002 | Ozasa et al. |
| 2003/0035451 A1 | 2/2003 | Ishida et al. |
| 2003/0091084 A1 | 5/2003 | Sun et al. |
| 2003/0095800 A1 | 5/2003 | Finizio et al. |
| 2003/0215194 A1 | 11/2003 | Kuhmann et al. |
| 2004/0101312 A1 * | 5/2004 | Cabrera ............. H04B 10/1149 398/172 |

(56) References Cited

U.S. PATENT DOCUMENTS

| | | |
|---|---|---|
| 2004/0120717 A1 | 6/2004 | Clark et al. |
| 2004/0207926 A1 | 10/2004 | Buckman et al. |
| 2004/0208596 A1 | 10/2004 | Bringans et al. |
| 2005/0019973 A1 | 1/2005 | Chua |
| 2005/0025210 A1 | 2/2005 | Aoyagi et al. |
| 2005/0025211 A1 | 2/2005 | Zhang et al. |
| 2005/0122720 A1 | 6/2005 | Shimonaka et al. |
| 2005/0129407 A1 | 6/2005 | Coleman |
| 2005/0147135 A1 | 7/2005 | Kurtz et al. |
| 2006/0067707 A1 | 3/2006 | Maniam et al. |
| 2006/0109883 A1 | 5/2006 | Lewis et al. |
| 2006/0268241 A1 | 11/2006 | Watson et al. |
| 2006/0274918 A1 | 12/2006 | Amantea et al. |
| 2006/0280219 A1 | 12/2006 | Shchegrov |
| 2007/0030570 A1 | 2/2007 | Jacobowitz et al. |
| 2007/0052660 A1 | 3/2007 | Montbach et al. |
| 2007/0099395 A1 | 5/2007 | Sridhar et al. |
| 2007/0153862 A1 | 7/2007 | Shchegrov et al. |
| 2007/0153866 A1 | 7/2007 | Shchegrov et al. |
| 2007/0242958 A1 | 10/2007 | Ieda |
| 2007/0273957 A1 | 11/2007 | Zalevsky et al. |
| 2008/0008471 A1 | 1/2008 | Dress |
| 2008/0205462 A1 | 8/2008 | Uchida |
| 2008/0273830 A1 | 11/2008 | Chen et al. |
| 2008/0317406 A1 | 12/2008 | Santori et al. |
| 2009/0027778 A1 | 1/2009 | Wu et al. |
| 2009/0141242 A1 | 6/2009 | Silverstein et al. |
| 2009/0245312 A1 | 10/2009 | Kageyama et al. |
| 2009/0278960 A1 | 11/2009 | Silverbrook |
| 2009/0284713 A1 | 11/2009 | Silverstein et al. |
| 2010/0066889 A1 | 3/2010 | Ueda et al. |
| 2010/0129083 A1 | 5/2010 | Mu |
| 2010/0129946 A1 | 5/2010 | Uchida |
| 2010/0265975 A1 | 10/2010 | Baier et al. |
| 2011/0002355 A1 | 1/2011 | Jansen |
| 2011/0148328 A1 | 6/2011 | Joseph et al. |
| 2011/0164880 A1 | 7/2011 | Davidson et al. |
| 2011/0176567 A1 | 7/2011 | Joseph |
| 2012/0120976 A1 | 5/2012 | Budd et al. |
| 2012/0134681 A1 | 5/2012 | Hamana et al. |
| 2012/0169669 A1 | 7/2012 | Lee et al. |
| 2012/0232536 A1 | 9/2012 | Liu et al. |
| 2012/0281293 A1 | 11/2012 | Gronenborn et al. |
| 2013/0076960 A1 | 3/2013 | Bublitz et al. |
| 2013/0226326 A1 | 8/2013 | Yoshida et al. |
| 2013/0266326 A1* | 10/2013 | Joseph ............... H04B 10/1141 398/130 |
| 2013/0278151 A1 | 10/2013 | Lear |
| 2015/0340841 A1 | 11/2015 | Joseph |
| 2016/0164261 A1 | 6/2016 | Warren |

FOREIGN PATENT DOCUMENTS

| | | |
|---|---|---|
| CN | 101226325 A | 7/2008 |
| CN | 101375112 A | 2/2009 |
| CN | 101854029 A | 10/2010 |
| DE | 102008030844 A1 | 12/2009 |
| EP | 1024399 A1 | 8/2000 |
| EP | 1317038 A2 | 6/2003 |
| EP | 1411653 A2 | 4/2004 |
| EP | 1345064 A3 | 12/2004 |
| EP | 1871021 A2 | 12/2007 |
| JP | H03-239374 A | 10/1991 |
| JP | 04-062801 A | 2/1992 |
| JP | 05-092618 A | 4/1993 |
| JP | H05-308327 A | 11/1993 |
| JP | 06-020051 A | 3/1994 |
| JP | H06-244502 A | 9/1994 |
| JP | 07-506220 A | 7/1995 |
| JP | H08-213954 A | 8/1996 |
| JP | H08-237204 A | 9/1996 |
| JP | H09-139963 A | 5/1997 |
| JP | H11-017615 A | 1/1999 |
| JP | 2001-246776 A | 9/2001 |
| JP | 2001-308797 A | 11/2001 |
| JP | 2001-311898 A | 11/2001 |
| JP | 2002-002015 A | 1/2002 |
| JP | 2002-026466 A | 1/2002 |
| JP | 2003-188460 A | 7/2003 |
| JP | 2003-224529 A | 8/2003 |
| JP | 2004-363756 A | 12/2004 |
| JP | 2005-102171 A | 4/2005 |
| JP | 2006-032885 A | 2/2006 |
| JP | 2006-067542 A | 3/2006 |
| JP | 2006-109268 A | 4/2006 |
| JP | 2006-148711 A | 6/2006 |
| JP | 2006-310913 A | 11/2006 |
| JP | 2008-028614 A | 2/2008 |
| JP | 2008-508730 A | 3/2008 |
| JP | 2008-118542 A | 5/2008 |
| JP | 2008-221658 A | 9/2008 |
| JP | 2008-277615 A | 11/2008 |
| JP | 2009-503611 A | 1/2009 |
| JP | 2009-049032 A | 3/2009 |
| JP | 2010-522493 A | 7/2010 |
| JP | 2010-531111 A | 9/2010 |
| JP | 2012-089564 A | 5/2012 |
| JP | 2013-502717 A | 1/2013 |
| WO | WO 1993/021673 A1 | 10/1993 |
| WO | WO 2000/016503 A1 | 3/2000 |
| WO | WO 2002/010804 A1 | 2/2002 |
| WO | WO 2003/003424 A1 | 1/2003 |
| WO | WO 2005/057267 A2 | 6/2005 |
| WO | WO 2006/015192 A1 | 2/2006 |
| WO | WO 2006/082893 A1 | 6/2008 |
| WO | WO 2008/115034 A1 | 9/2008 |
| WO | WO 2011/021140 A2 | 2/2011 |
| WO | WO 2012/106678 A1 | 8/2012 |
| WO | WO 2017/184455 A1 | 10/2017 |

OTHER PUBLICATIONS

A. Gadallah. "Investigations into Matrix-Addressable VCSEL Arrays", Annual Report 2008, Institute of Optoelectronics, Ulm University.
International Patent Application No. PCT/US2013/42767; Int'l Preliminary Report on Patentability; dated May 6, 2015; 33 pages.
Overton; High-Power VCESLs Rule IR Illumination; Laser Focus World; Aug. 2013; 2 pages.
European Patent Application No. 13882974.2; Extended Search Report; dated Oct. 5, 2016; 9 pages.
European Patent Application No. 18183404.5; Extended Search Report; dated Aug. 16, 2018; 7 pages.
Chen et al.; "Collimating diode laser beams from a large-area VCSEL-array using microlens array"; IEEE Photonics Technology Letters; vol. 11; May 1999; p. 506-508 (English Abstract).

* cited by examiner

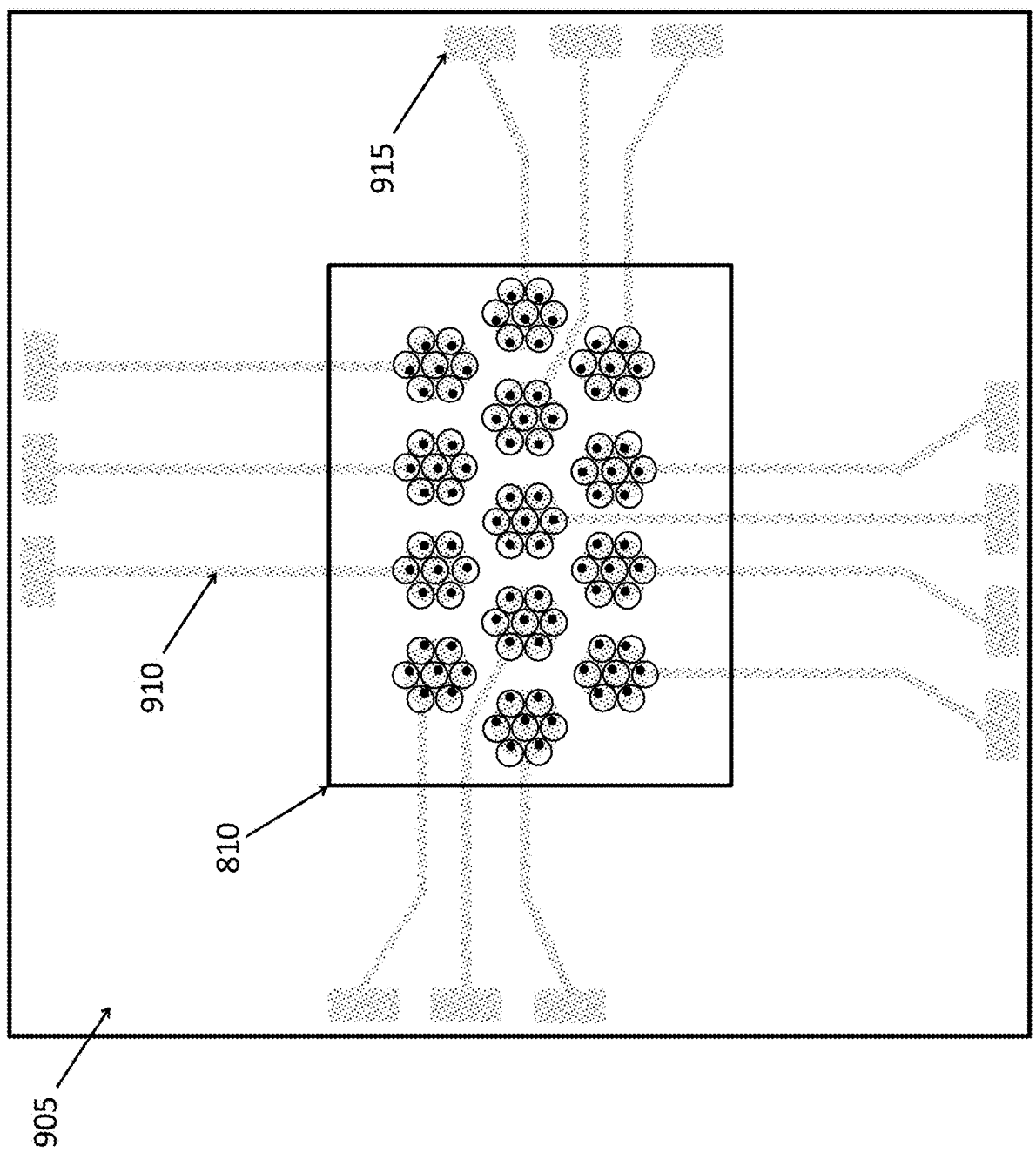

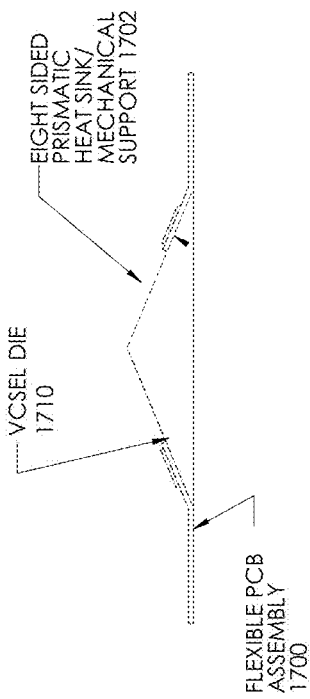
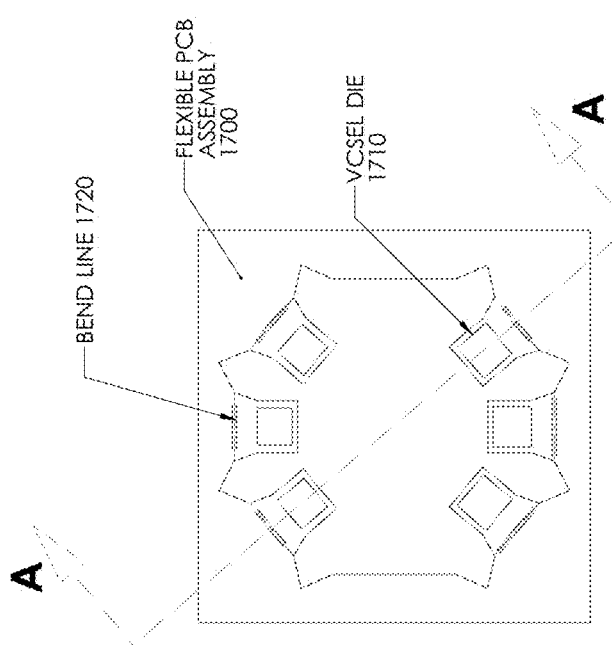
Figure 17C
Figure 17A
Figure 17B

WIDE-ANGLE ILLUMINATOR MODULE

CROSS REFERENCE TO RELATED APPLICATIONS

This application claims benefit under 35 U.S.C. § 119(e) of Provisional U.S. Patent Application No. 62/668,750, filed May 8, 2018, entitled "Wide Angle Illuminator Module," the contents of which is incorporated herein by reference in its entirety.

This application is also a continuation-in-part of U.S. patent application Ser. No. 14/946,730, filed Nov. 19, 2015, entitled "High Speed Free-Space Optical Communications," which is a divisional of U.S. patent application Ser. No. 13/594,714, filed Aug. 24, 2012, entitled "High Speed Free-Space Optical Communications," which claims benefit under 35 U.S.C. § 119(e) of Provisional Application No. 61/671,036, filed Jul. 12, 2012, entitled "Free-Space Optical Communications," and of Provisional Application No. 61/528,119, filed Aug. 26, 2011, entitled "High Speed Free-Space Optical Communications," each of which are incorporated herein by reference in their entirety.

TECHNICAL FIELD

Optic systems and, more particularly, compact near infrared illumination systems and methods that enable control of the field of illumination of an electronic imaging system.

BACKGROUND

Near infrared (NIR) illumination is increasingly popular for enhancing the performance and utility of imaging sensors in automotive, mobile and consumer applications. The image sensors are used for object detection, driver monitoring, gesture recognition and other similar three-dimensional sensing applications or time-of-flight imaging. In addition to adding low light and nighttime capabilities, the illumination can be used to highlight regions of interest and enable filtering out the ambient lighted background for the benefit of image processing algorithms. A major complication for these image processing applications is the modest dynamic range of current electronic image sensors. Subjects or areas of interest captured by the electronic image sensors are often too bright, saturating the detector so that detail is not visible. Hence, a wide-angle illuminator is desirable.

Most current NIR illumination systems are based on light-emitting diodes or LEDs. LEDs have the advantage of low cost and freedom from speckle or coherence noise, which can seriously complicate image processing. The disadvantages of LEDs in this role include the very broad emission profile that is difficult to concentrate to a smaller field and limited optical conversion efficiency at higher powers. See, Overton, G. "High-power VCSELs rule IR illumination," Laser Focus World, Aug. 29-30, (2013). LEDs also have a very broad spectral output, which complicates the filtering out of solar background, and which means some light remains visible to the subjects being illuminated, which can be distracting. Conventional laser diode sources can be used for illumination with narrow spectral emission, well defined beams and higher efficiency. However, a single laser source with sufficient power for illuminating the field of illumination (FOI) will have significant "speckle" or coherence noise from mutual interference of the beam with its own scattered light. In addition, the point source characteristics of single laser sources result in low eye-safe exposure levels.

Multi-zone illuminations systems, where each zone addresses a separate section of a combined field of illumination (FOI) and can be controlled by an electronic system so that the zones are turned on in a sequence and with pulse timing, allow for efficient use in electronic imaging systems and for three-dimensional sensing. In PCT/US2017/027674, microlenses positioned over each VCSEL in a VCSEL array are used to control the direction and shape of light output by offsetting certain of the mircolenses relative to the optical axis of their corresponding lasers. There is a limit, however, to how far the microlenses can be offset to provide an off-axis beam direction due to the off-axis aberrations of a simple lens system used in this manner and optical losses due to increasing internal reflection from the lenses as offset is increased.

SUMMARY

A wide-angle illuminator module is disclosed. The module includes a rigid support structure having a plurality of angled faces, a flexible circuit including one or more VCSEL arrays, each VCSEL array positioned over a face among the plurality of angled faces, each VCSEL array including a plurality of integrated microlenses with one microlens positioned over each VCSEL in the VCSEL array, and a driver circuit for providing electrical pulses to each VCSEL array, wherein the plurality of VCSEL arrays address illumination zones in a combined field of illumination. The support structure may also be a heatsink. The flexible circuit may be a single flexible circuit configured to be placed over the support structure or a plurality of flexible circuits, each including one VCSEL array.

BRIEF DESCRIPTION OF THE DRAWINGS

The drawings are provided to illustrate example embodiments described herein and are not intended to limit the scope of the disclosure.

FIG. 8 is a diagram of a sub mount showing electrical connections to each of the 13 sub arrays illustrated in FIG. 7A;

FIGS. 17A, 17B and 17C are illustrations of an example of an all in one flexible PCB that may be positioned over a prismatic structure.

DETAILED DESCRIPTION OF ILLUSTRATIVE EMBODIMENTS

Devices, systems and methods are described herein for enabling control of the field of illumination of an electronic imaging system having multiple illumination sources directed at different regions or zones of an area or volume, such as a field of view of a camera, to provide adjustable and wide-angle field of illumination to the separate zones. A wide-angle multi-zone illuminator, as described herein, may enable a variety of additional or enhanced functions of the image sensor(s) or cameras, such as object tracking, driver monitoring, gesture recognition, etc., that may be enhanced by specific wide-angle lighting characteristics in one or more zones or subdivisions of the field of view of the image sensor.

In some instances, the wide-angle multi-zone illuminator, also referred to herein as one or more illumination sources or arrays, may include near infrared (NIR) illumination sources, such as a laser array including multiple laser devices. In one example, the multiple illumination sources may include vertical-cavity surface-emitting laser (VCSEL) arrays mounted on one or more flexible PCBs arranged on a multi-faceted heat sink/support structure. The combination of many low-power incoherent emitters greatly reduces coherence noise compared to conventional laser diodes and acts as an extended source with higher eye-safe intensities.

Figure 1:
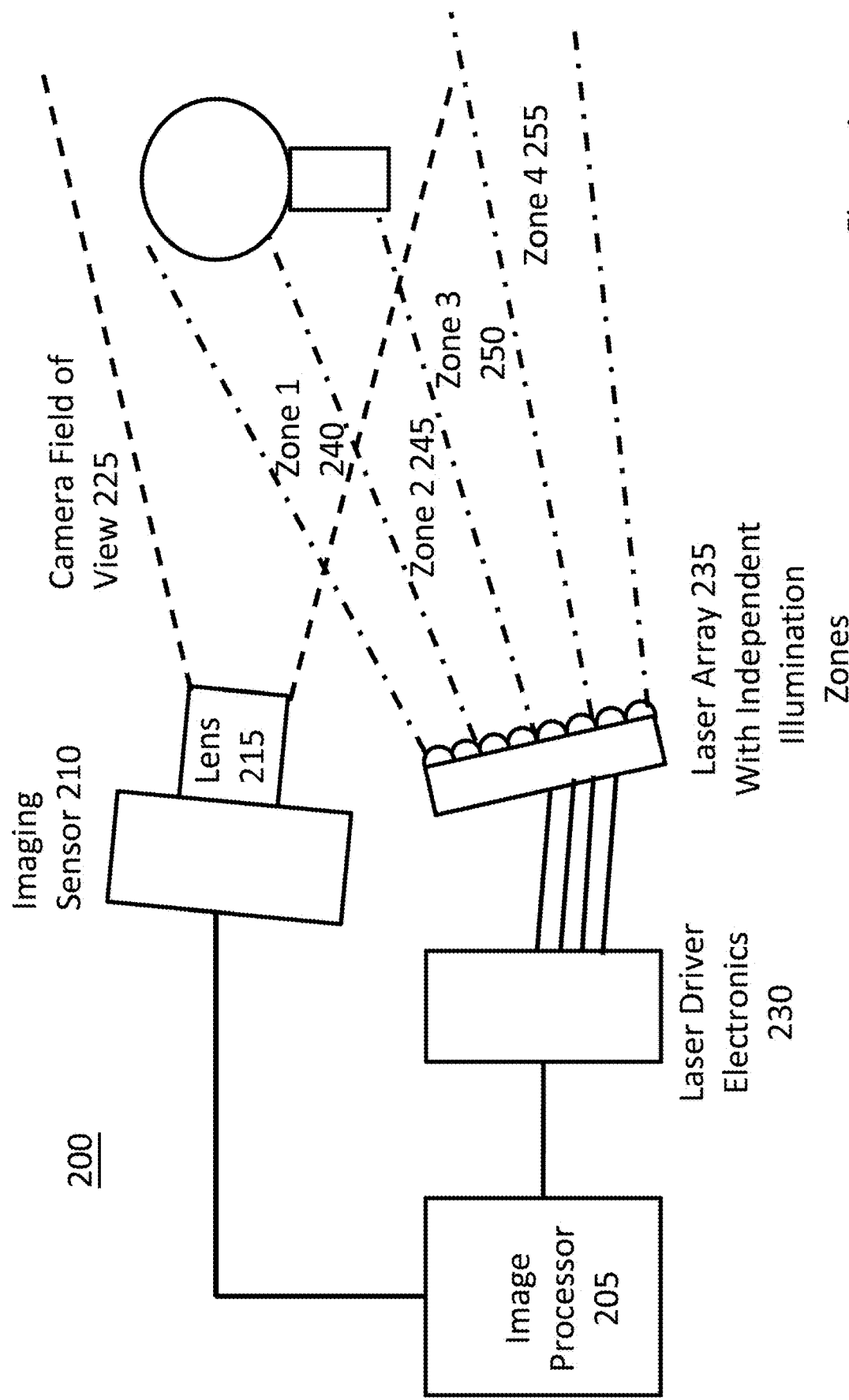
FIG. 1 is a diagram of an example optic system including a multi-zone illuminator that provides illumination to multiple zones of a field of view of an image sensor.

FIG. 1 depicts an optic system 200 including a multi-zone illuminator and an imaging sensor both in communication with an image processor/computing device that may be suitable for wide-angle illumination in accordance with present embodiments. The multi-zone illuminator may include a laser array 235 providing illumination for multiple independent zones: zone 1 240, zone 2 245, zone 3 250, and zone 4 255. It should be appreciated that the laser array 235 may have number of different zones, defined in different ways, such as by angle, distance, etc., as will be described in greater detail below. The laser array 235 may be controlled through laser driver electronics 230, which may separately communicate with each of multiple sub arrays of laser array 235 (e.g., with each sub array corresponding to a different zone, as illustrated). The laser driver electronics 230 may determine and provide power and/or a level of current to each of the sub arrays of array 235 to illuminate a desired FOI and/or to control an illumination intensity provided by each sub array. An image processor 205 may be in communication with the laser driver electronics 230 and/or the laser array 235, and may control or dictate the amount of current delivered to each sub array, to control the amount of illumination intensity provided in each of zones 240-255.

In some aspects, the image processor may also be in communication with one or more imaging sensors 210. Imaging sensor 210 may include a lens 215 that may capture image data corresponding to a camera field of view 225. In some cases, the data captured by the imagine sensor 210 may be enhanced by specific illumination or light provided to various zones or areas/volumes of the field of view 225. In some cases, the zones 240-255 may correspond to areas at a certain distance from the image sensor 210/lens 215, or may correspond to volumes within the field of view 225.

In some cases, the image processor may obtain information from the image sensor 210, including information defining or specifying the field of view 225 of the image sensor 210, such as by angle, distance, area, or other metrics. In some cases, the information may include a subset of the total field of view 225 that is of particular interest, such as including one or more objects 220, defined by a distance from the image sensor 210, a certain angle range of the field of view 225, etc. In some cases, this information may change and be periodically or constantly sent to the image processor 205, such as in cases of tracking one or more objects 220. The image processor may receive this information, and in conjunction with laser driver electronics 230, may control the laser array 235 to provide different illumination intensities to different zones 240-255. In some cases, the laser array 235 may be controlled to provide a determined optimal level of illumination to different zones 240-255. The optimal level may be determined based on any number of factors, including physical characteristics of the image sensor 210/lens 215, characteristics of the object or objects of interest 220, certain areas of interest within the field of view 225, other light characteristics of the field of view 225, and so on.

In some aspects, the applications or devices, such as imaging sensor(s) used for detecting or tracking moving objects, such as object 220, tracking or detecting gestures of a user, etc., that can utilize the described multi-zone illuminator 235 may already have a computational unit (e.g., corresponding to image processor 205) processing the image data. In these cases, the multi-zone illuminator 235 may be connected to existing systems and function via a software/hardware interface. The software interface may be modified to include detection of the illumination level of different zones of the image field of view, corresponding to the illumination zones that are provided by the illuminator 235, and provide feedback signals to the laser array driver electronics 230 to modulate the light intensity for each zone.

In one example, the modulation of the FOI and/or light intensity can be performed through typical laser or LED driver electronic circuits 230 that control the direct drive current to each laser 235 or commonly-connected group of lasers (sub arrays) or use pulse-width modulation of a fixed current drive to each laser or commonly-connected group of lasers or other current modulation approaches. Since they are separately connected to the driver electronics, the illumination zones 240-255 can be modulated independently, including modulation in synchronization with electronic shutters in the imaging electronics. The illumination zones 240-255 can also be driven sequentially or in any other timing pattern as may be preferred for the image processing electronics.

Figure 2:
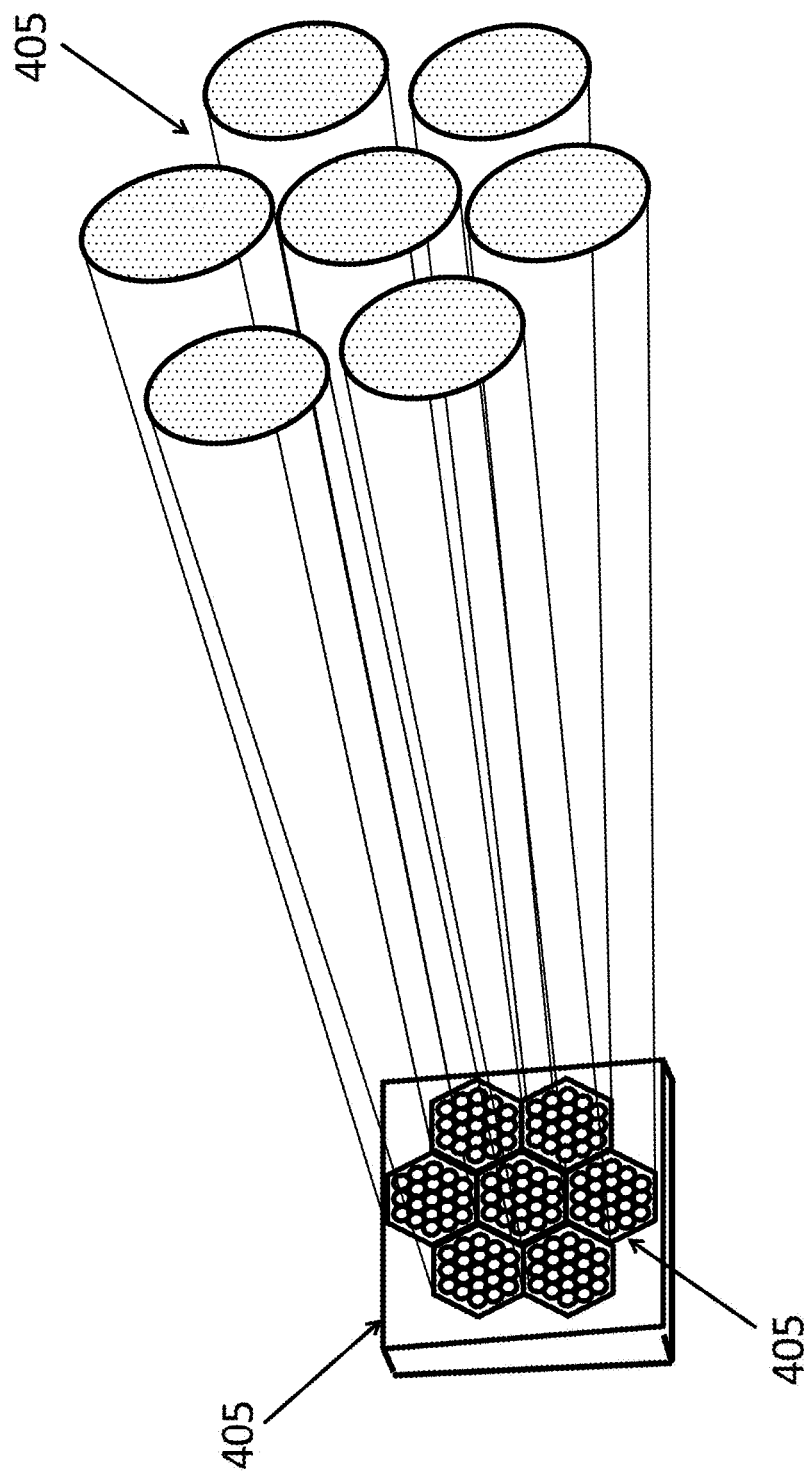
FIG. 2 illustrates an example FOI produced by an illumination module or array including seven laser arrays.

The system 200 depicted in FIG. 2 is shown with four independent illumination zones 240-355, each zone independently driven by the driver electronics 230 to control the FOI and/or intensity of illumination in each zone, but any number of different zones may be utilized. The illuminator 235 is depicted as a single module with four separately connected laser arrays or sub arrays. The optical separation of the laser array outputs into separate beams addressing different parts of the imaging system or camera field of view 225 is described in more detail below. Optical system 200 may have any number of illumination zones, limited by the practical issues of cost and complexity of providing for the additional lasers, connections to the laser arrays and the driver electronics for each independent laser or laser array in the module.

In some aspects, individual illumination zones, such as zones 240-255 may be dynamically controlled, such that one or more zones are turned on and off, or the illumination intensity of one or more zones modified, in response to feedback from the image sensor 210. Dynamic adjustment of the illumination pattern resulting from multiple zones 240-255 may be carried out or controlled by the image processor 205.

FIG. 2 depicts the illumination field provided by an illumination module or illuminator 405 with seven laser arrays 410 distributing the light in a two-dimensional pattern represented by projected areas 450 a certain distance from the illuminator 405. Each laser array 410 may include a number of individual lasers. In the example illustrated, each laser array 410 includes 19 individual laser devices; however, it should be appreciated that each laser array may include any number of laser devices, and one or more laser arrays of module 405 may include a different number of lasers. In this example, the position of the illumination zones 450 correspond to the location of the laser arrays 410 in the module 405. As will be described in more detail below, this correspondence is not necessary, such that the location of one or more emitting laser arrays 405 on the module 405 may not directly correspond to the location (e.g., direction and relative position) of the illumination field 450 of that array. In some cases, a two-dimensional arrangement of laser arrays 410 on the module 405 can be configured to generate a three-dimensional sequence of illumination zones.

Figure 3:
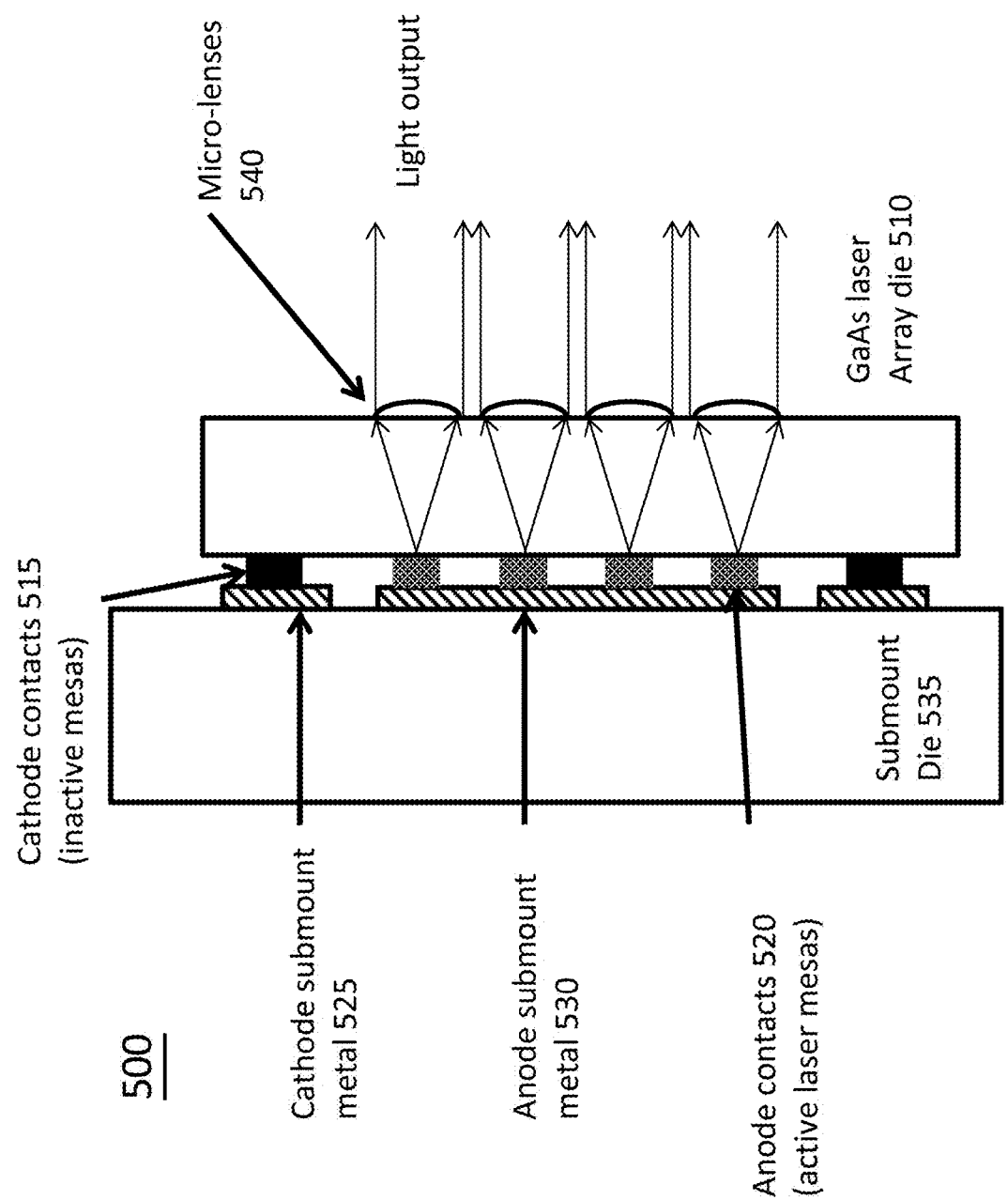
FIG. 3 is a cross-sectional view of an example VCSEL array device with microlenses integrated directly into the laser array die.

One embodiment of the illumination module is depicted in FIG. 3. One example of an illumination module 500 is described in more detail in commonly owned U.S. Pat. No. 8,848,757, issued Sep. 30, 2014, filed Mar. 31, 2011 and entitled "Multibeam Arrays of Optoelectronic Devices for High Frequency Operation." The laser arrays are fabricated on one surface of a Gallium Arsenide die 510 in a process that allows both the cathode 515 and anode 520 contacts to be made on the same surface of the die. Those contacts are made through metal patterns 525 and 530, respectively, on the surface of a separate submount die 535 that may be made of ceramic, fiberglass resin printed circuit board material or other materials suitable for electronic packaging or circuit fabrication. The two die 510, 535 are aligned and bonded using conventional flip-chip bonding processes. This structure allows fabrication of micro-optical elements 540 in the substrate of the laser die. The micro-optical elements 540 may be refractive micro-lenses as shown, or may be diffractive elements. In either case the micro-optical elements 540 can be etched directly into the substrate material using well-known photolithographic processes, forming a completely monolithic optical device. This approach has many advantages in producing a rugged device with minimal assembly steps. An anti-reflection coating may be added to the surface of the substrate to minimize loss of light from internal reflections from the surface.

Figure 4:
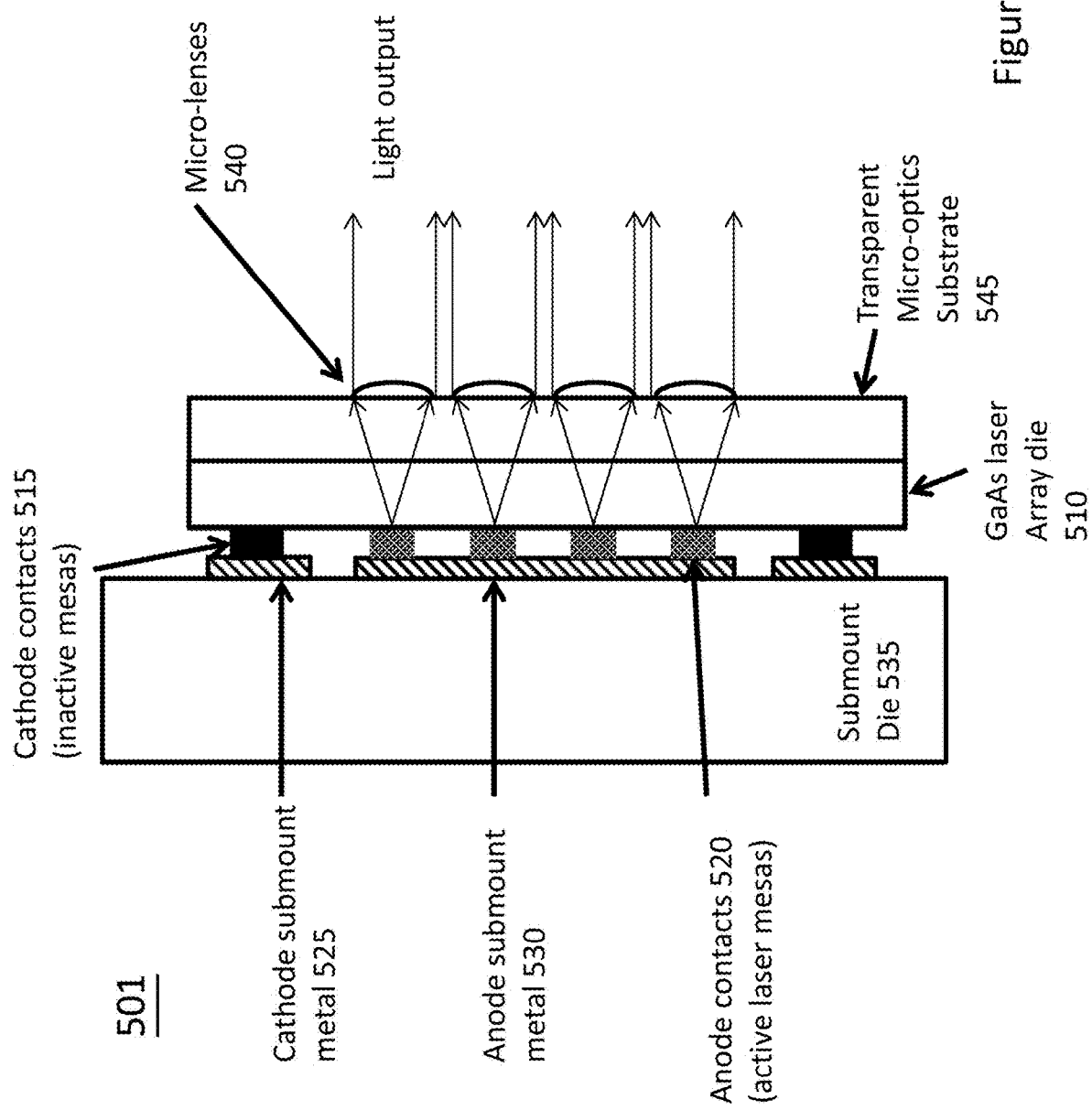
FIG. 4 is a cross-sectional view of an example VCSEL array device with microlenses integrated into a micro-optics substrate positioned over the laser array die.

An alternative embodiment of the illumination module is shown in FIG. 4. This structure 501 has the lasers fabricated in a Gallium Arsenide die 510 as described previously. The laser die 510 is bonded to a submount die 535 that enables the electrical connections as described above. The micro-optical elements 540 in this case are fabricated in a separate substrate 545. The two parts 510 and 545 are aligned to each other and either bonded together as shown or assembled together with an air space between the parts using active or passive alignment and assembly processes well-known to the optoelectronic industry. The micro-optical substrate 545 can be the same material as the laser array 510, or may be a different material such as glass or transparent polymer. The use of a different material allows for a variety of fabrication processes to be used for fabrication of the micro-optical elements 545. Anti-reflection coatings may be used on the inner and outer surfaces of the micro-optical substrate 545 to minimize losses from reflections. This approach has the advantage of separately yielding the laser array 510 and the micro-optical elements 545 at the cost of additional assembly processes.

In either of these embodiments of FIG. 3 and FIG. 4, the submount 535 allows for separate electrical contact to individual lasers or groups of lasers through the patterned contact metal 525, 530 on the surface of the submount 535. This allows for separate driver circuit current channels for each independently addressed laser or group of lasers.

Figure 5:
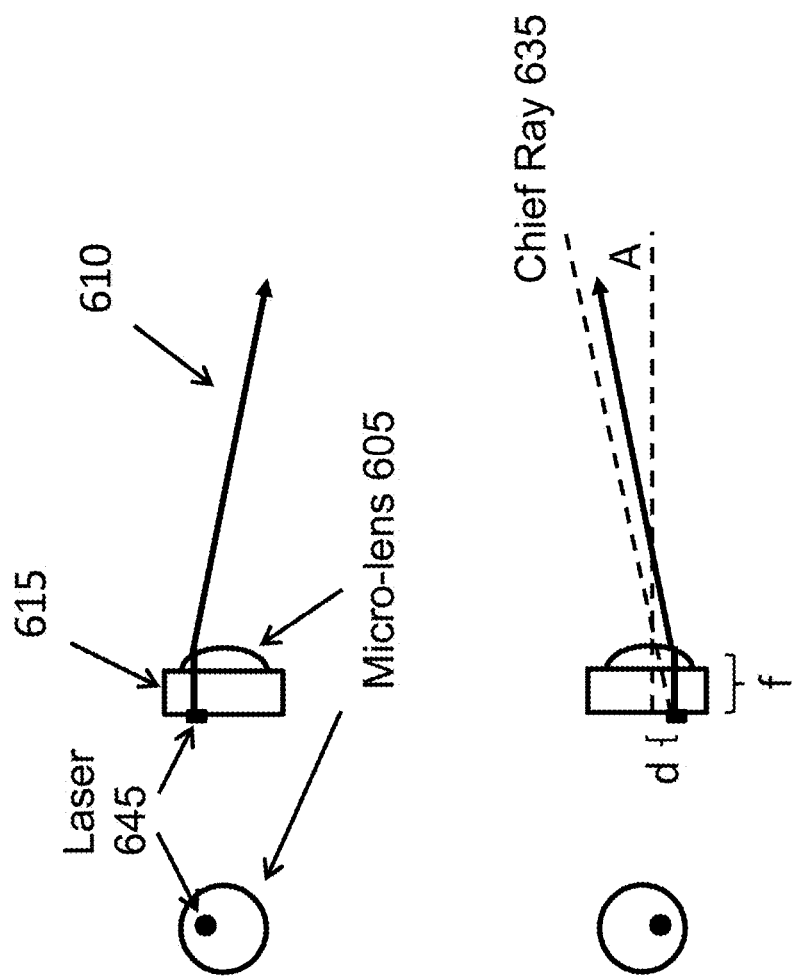
FIG. 5 illustrates an example light path produced by a micro-lens that may be implemented on the illumination arrays of FIG. 3 or FIG. 4.

Each separately addressed laser or group of lasers can have an output beam whose direction and angular spread is at least partly determined by the micro-optical elements. FIG. 5 depicts an example micro-lens 605, which may be positioned on the output side of substrate 545 as described in reference to FIGS. 3 and 4. The micro-lens 605 can produce an output beam 610 that leaves the substrate (here depicted as element 615) at an angle to the surface perpendicular. The offset of the lens axis 625 relative to the axis 630 of the laser 645 (depicted as a distance d) determines the angle at which the beam 610 propagates from the die surface or substrate, such as die 510 or substrate 545. The chief ray 635, defined as the optical ray from the center of the laser source through the geometrical center of the micro-lens 605, defines the angle of propagation, which is represented as tangent $A = d/f$, where f is the focal length of the micro-lens 605 in the same distance units as d. There are other factors to considered, such as diffraction and the relative size of the laser aperture and micro-lens aperture in detailed design of the illuminator.

If the micro-optical element 605 is a diffractive structure, similar to a Fresnel lens or curved diffraction grating, then the physical offset in position of the micro-optic is not necessary and the diffractive structure is designed to produce the desired angular direction of the beam by well documented mathematical techniques.

The angular spread of the emitted beam 610 from each individual laser 645 or a group of lasers can also be controlled by the micro-optical elements. Each micro-lens 605 can produce a beam 610 that has a lower angular divergence, or a larger angular divergence, than the divergence of the laser 645 itself by the choice of focal length of the lens. The focal length of the lens is determined by the radius of curvature and index of refraction of the micro-lenses. The focal length of the micro-lens can decrease the divergence of the light emitted from a single emitter by acting as a collimating lens. This effect is limited by the relative size of the emitting aperture of a single laser to the size of the micro-lens. A larger source size relative to the micro-lens aperture will increase the divergence of the beam even when the source is located at the focal distance from the lens for best collimation. If the micro-lens is fabricated so that its focal length is shorter or longer than the best collimation focal length, the beam from that emitter will diverge more rapidly than from the divergence from the same laser emitter without a micro-lens.

Figure 6:
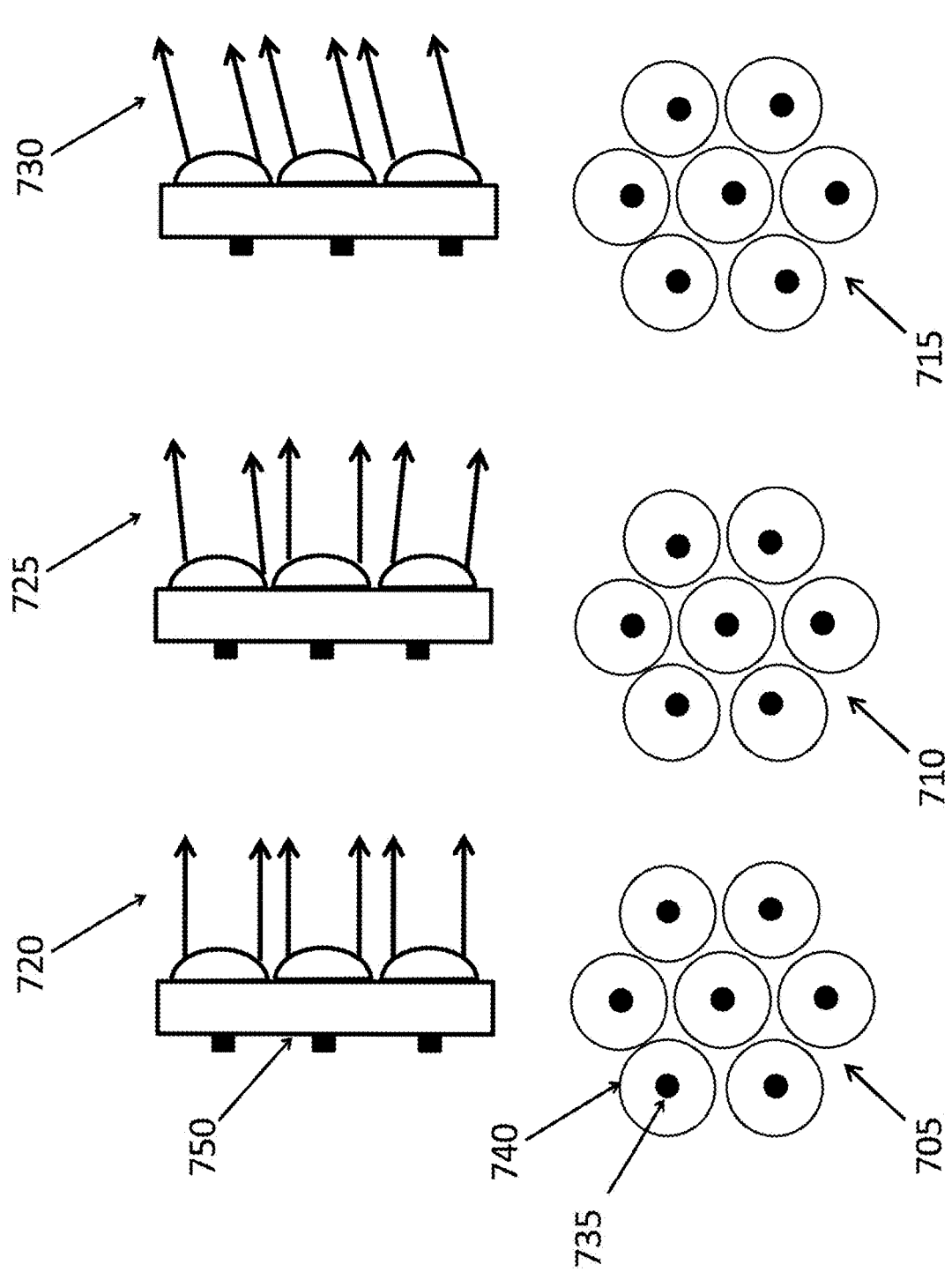
FIG. 6 illustrates example light paths produced by a group of seven micro-lens having different radial offsets, which may be implemented on the illumination arrays of FIG. 3 or FIG. 4.

In addition, a group of lasers can have a collective beam that has greater divergence in the far field by a radial offset of the micro-lenses, as shown in FIG. 6. Three different groups 705, 710, and 715, of micro-lenses and lasers, such that each forms a laser array, are illustrated, each with lasers/micro-lenses having different offsets in the position of the micro-lenses relative to the lasers to produce beams having different directions 720, 725, 730, which will result in different illumination patterns. Micro-lenses can be used with combined linear (between each micro-lens) and radial offsets (described above) to produce beams from a group of lasers that have both a specified angle of propagation in the field of view of the imaging detector and a specified angular spread. By designing a laser die that has several separately connected groups of lasers, each with micro-lenses aligned to produce a beam to illuminate a separate angular zone within the field of view of the detector, a complete illumination system may be fabricated in a single compact module.

As depicted in FIG. 6, each laser array 705, 715, 720 may include seven laser devices 735 each having a corresponding micro-lens 740, arranged with one laser in the center of the array, and 6 lasers surrounding the center laser in a circular formation. Each of the seven lasers 735 in array 705 may have zero radial offset (e.g., positioned in the center of micro-lens 740) to produce beams 720 directed perpendicular to the substrate/laser die 750. In this case, if the micro-lenses are fabricated with focal lengths (or a radius of curvature corresponding to a focal length) that equal the optical path length to the emitters for best collimation, the array will emit a relatively narrow beam (the combined beams of the 7 individual laser emitters) in a direction perpendicular to the device surface.

The center laser of array 710 may have a zero radial offset, while the six outer laser devices of array 710 may have a radial offset that places the lasers toward the center of array 710's center laser. Array 710 may produce beams 725 that diverge to produce an illumination pattern that expands as distance from the array 710 increases. The 6 outer micro-lenses are offset away from the center axis by a fixed offset that is a fraction of the micro-lens diameter so that significant amounts of light from the lasers are not incident outside the corresponding micro-lens. If the array is larger, then the next ring of micro-lenses (12 additional micro-lenses in a hexagonal array layout) will be two times the offset value relative to the corresponding laser axes. This radial offset can be easily realized in designing the array by using a different pitch for the hexagonal array of lasers than for the hexagonal array of micro-lenses and aligning the central laser and micro-lens to each other. The result is that a radial offset between the micro-lenses and laser emitters that increases by the pitch difference for each larger ring of the array. The example shows a radial offset that places the micro-lenses farther from the array center than the emitter apertures by using a larger pitch for the micro-lens array than the laser array. This will result in a combined beam that diverges more rapidly than the beam divergence due to just the micro-lens focal length. An alternative design can use a smaller pitch for the micro-lens array than for the laser array. That design will create a combined beam that converges for a short distance before the beams cross each other and diverge apart. That approach may have utility for illumination of objects at a short distance for microscopy, material heating or other applications.

All of the lasers of array 715 may be globally offset in the same direction and the same distance, for example, to produce beams 730 that are all directed in the same direction, offset from the beams 720 of array 705. As described previously, the offset of the micro-lenses relative to the location of the laser emitting aperture causes the beam to be emitted at angle defined to first order by the direction of the chief ray. This allows the calculation of how much offset is required to get a desired angle of deviation from the perpendicular to the illuminator surface. More precise calculation of the global offset to direct a combined beam of emitters in desired direction can be done with ray tracing techniques or beam propagation calculations. Both radial and global offsets can be combined in a single array (e.g., combining aspects of arrays 710 and 715), so that both the divergence and direction of the combined beams may be simultaneously determined by the design of the micro-lenses and laser array. It should be appreciated that arrays 705, 710, and 715 are only given by way of example. Other configurations, other numbers of lasers, etc., are contemplated herein.

Figure 7A:
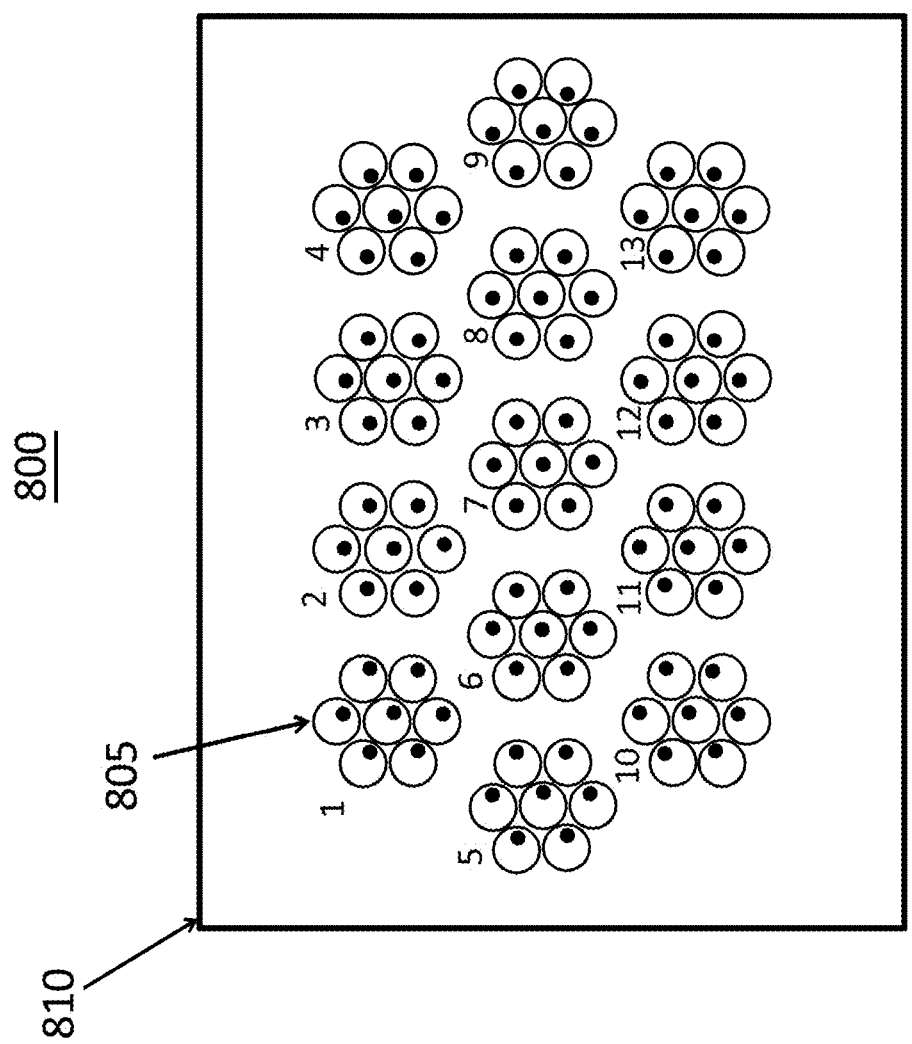
FIGS. 7A and 7B illustrate a group of 13 sub arrays, with each sub array having a certain radial offset, and the corresponding illumination pattern provided by the group of sub arrays.
Figure 7B:
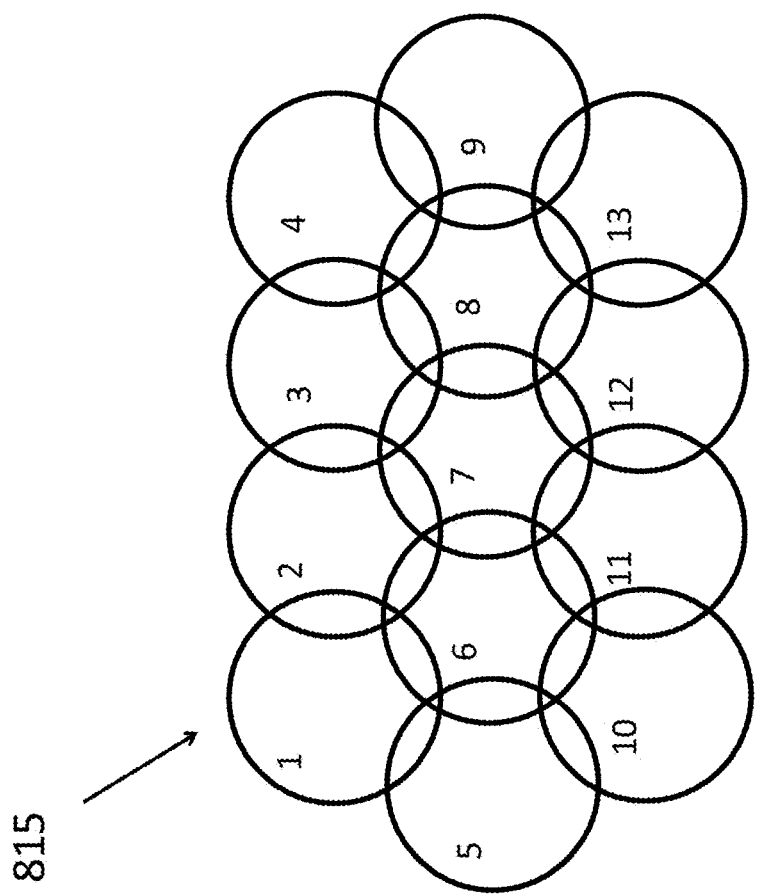

FIGS. 7A, 7B, and 8 show an example of a 13-zone illuminator 800. FIG. 7A shows the 13 laser arrays 805 numbered 1-13, on a single die 810. FIG. 7A depicts the lenses corresponding to each laser on the substrate side of the laser die 810. The laser locations are shown as dots. The lasers may be fabricated on the opposite side of the die, with the light transmitting through the substrate. The resulting illumination pattern 815, as if projected on a screen some distance from the device, is shown in FIG. 7B. In this example, the pattern 815 covers approximately a 45°×25° field of view, with each circle depicting a beam of approximately 12° diameter. The overlap shown is intentional to give a uniform illumination pattern across the whole field when all the beams are turned on at a similar power level. In this design, all the beam shaping is done by the micro-lenses, such that there is no need for an external lens. FIG. 8 depicts a top view of the laser die 810 positioned as bonded to the submount 905. An anode metal pattern 910 is illustrated on the submount 905. The bond pads 915 on the submount 905 allow electrical connection, through conventional semiconductor packaging technology, to the laser driver circuits, such as driver 230 described in reference to FIG. 1. There is also a cathode metal pattern (not shown) that may fill much of the space between the anode metal 915 and allow a return current path.

The example in FIGS. 7A and 7B show a correspondence between the position of the laser array 805 that produces each beam with the location of the beam in the far field, such as illumination pattern 815. This correspondence, however, is not necessary. The location of the laser arrays 805, with associated micro-lenses, on the laser array die 810 do not necessarily determine the location of the beam in the field of view of the detector. The location of a beam in the far field or field of view of an associated image sensor or camera is almost entirely due to the angular displacement and spread of the beam as determined by the micro-lens properties and position. Relocating the array 805 associated with the beam to a different position on the laser die 810 only shifts the beam by the very small distance (a few millimeters at most) that it is shifted on the die 810. This shift becomes inconsequential once the beams have expanded over a small distance. This property can be used to enhance the eye safe tolerance for the illuminator. The apparent size of a light source has a direct influence on the damage tolerance of the retina, as the larger source cannot be imaged to as small a spot on the retina as a smaller source. This is well documented in the laser safety standards. If an observer is close to the array 800 depicted in FIGS. 7A, 7B, and 8, there is the possibility that light from adjacent beams be imaged by the observer's eye and the eye safety threshold be exceeded, even if the individual beams are determined to be safe at the operating power level. This safety concern is due to the fact that the arrays that are the source of the adjacent beams are adjacent to each other themselves and will be imaged in close proximity to each other on the observer's retina. This problem can be prevented by placing the laser arrays that are sources for beams that are directed to adjacent angular spaces in the far field of the lasers further away from each other so that their sources cannot be imaged adjacent to each other by the observer's eye.

Figure 9A:
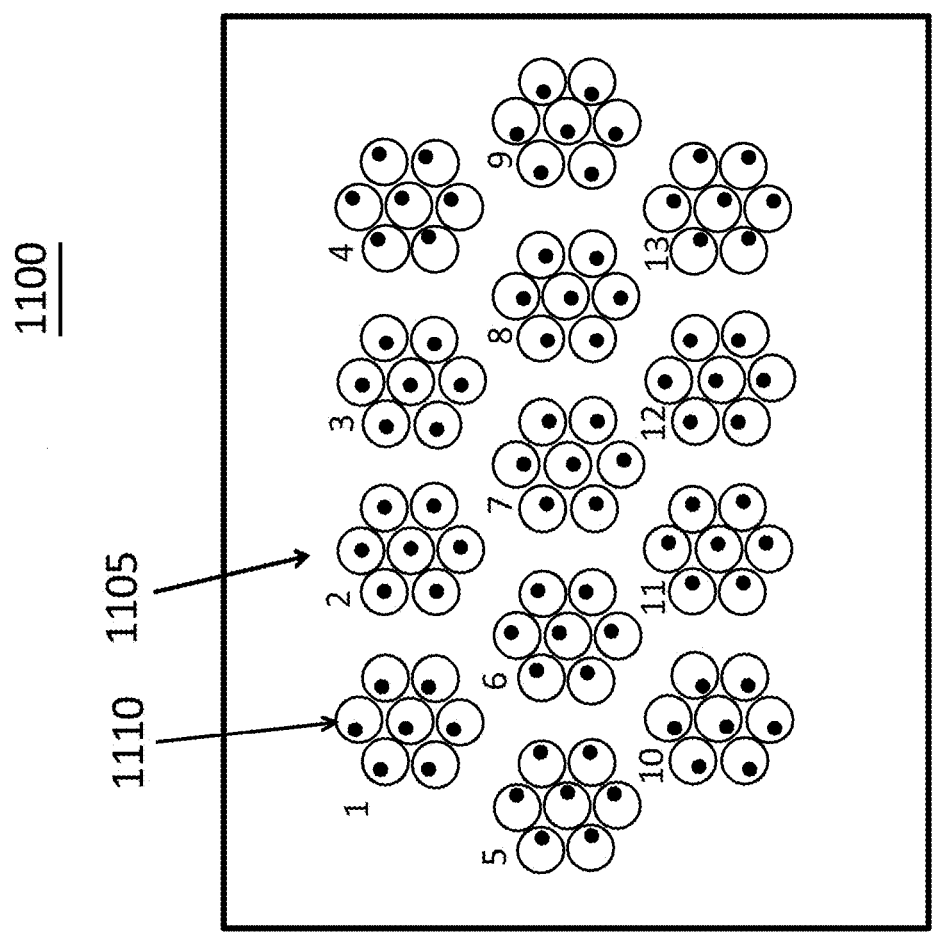
FIGS. 9A and 9B illustrate another group of 13 sub arrays, with each sub array having a certain radial offset, rearranged for better eye safety and the corresponding illumination pattern provided by the group of sub arrays.
Figure 9B:
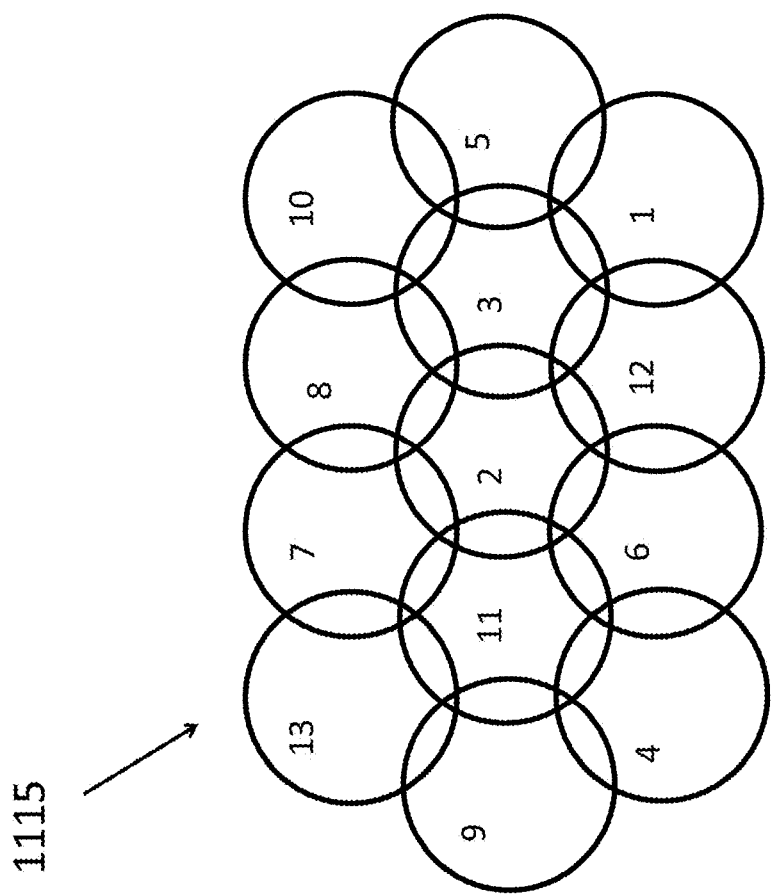

FIG. 9A depicts a version of the 13-zone illuminator 1100 in which the array locations 1105 are switched so that adjacent laser arrays are not directing their beams in similar angles. This and similar configurations of the laser arrays 1105 may be used to maintain or increase eye safety of the entire laser array while operating at higher power/intensity levels. This is done by simply rearranging the offsets of the micro-lenses 1110 to the laser axes as shown. The correspondence of the array locations to the beam positions 1115's illumination pattern is depicted in FIG. 9B.

Figure 10:
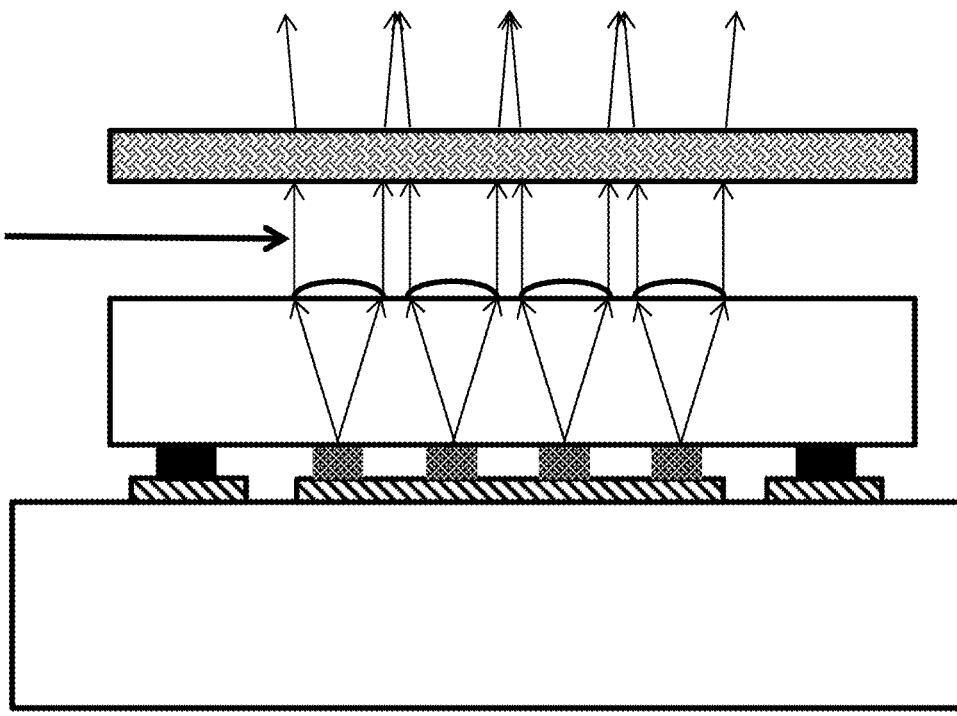
FIG. 10 is a diagram of an example VCSEL array device in combination with a diffuser.

Further eye safety improvements can be made for higher power operation for longer ranges by adding a diffuser 1200 in front of the illuminator/laser 1205 as shown in FIG. 10. The diffuser 1200 also makes the apparent size of the source 1210 larger by the amount the beam has expanded at the location where it intersects the diffuser. Holographic diffusers have the property that they can be used to add a limited amount of increased divergence to the beams without changing the beam direction, so that the capability of the illuminator/laser 1205 to address different regions within the detector field of view is not diminished.

The techniques described in U.S. Pat. No. 9,232,592B2 may be combined with the multi-zone illuminator described herein. The individual zones of the illuminator may be controlled electronically (e.g., by the image processor 305 and laser drive electronics 330 illustrated in FIG. 3) so that the exposure duration of the subject from each zone of the illuminator is limited to keep the exposure below the eye safety limits at all times. By switching the drive current from one subarray or illumination device (e.g., laser or VCSEL array) to the other in sequence, the total exposure to the observer's eye can be limited. The fact that the illumination zones will be imaged on different locations on the observer's retina is an added factor in increasing the exposure tolerance of the eye to the illumination level.

As previously noted, there may be limits to the size of angular field that the illuminator can cover using only the integrated micro-optical elements. If the micro-optical elements are micro-lenses, they will have losses from internal reflections and beam profile distortions from off-axis aberration as the deflection angles increase. Similarly, diffractive elements will have higher diffraction losses and become more difficult to fabricate at large deflection angles. In an embodiment, illustrated in FIG. 11, in order to increase the field coverage of an illuminator/laser 1205, an external optic 1220 can be added in addition to the integrated micro-lenses 1225.

Figure 11:
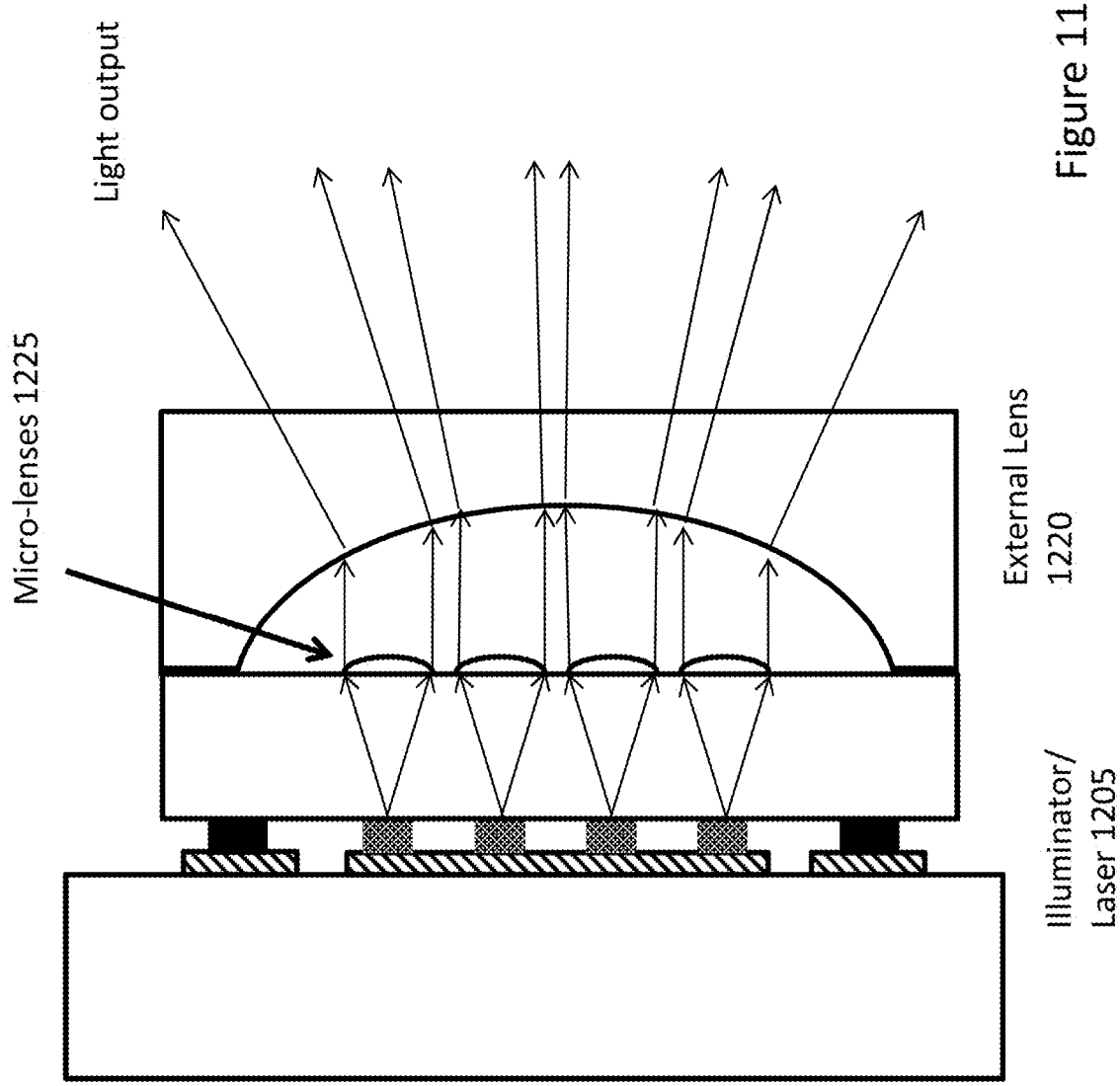
FIG. 11 is a diagram of an example VCSEL array device in combination with an external optic.

The external optic 1220, which may be a larger aperture device that can change the beam direction and divergence properties for all of the beams at once, may be placed after the micro-lenses 1225, as illustrated in FIG. 11. A negative power optic, which is an example of external optic 1220, as depicted, can increase the divergence of the beams and increase their off-axis angular direction to cover a larger field of view. A special case of this external optic 1220 has a toroidal optical surface with two different radii of curvature for the vertical and horizontal axes. This external optic allows for different increases (or decreases) of the beam angle and divergence separately in the vertical and horizontal directions. The external optic can also be another micro-lens array, in which a second substrate with an array of micro-lenses with additional offsets can be used to increase the deflection angle of the beams (not shown).

Figure 12:
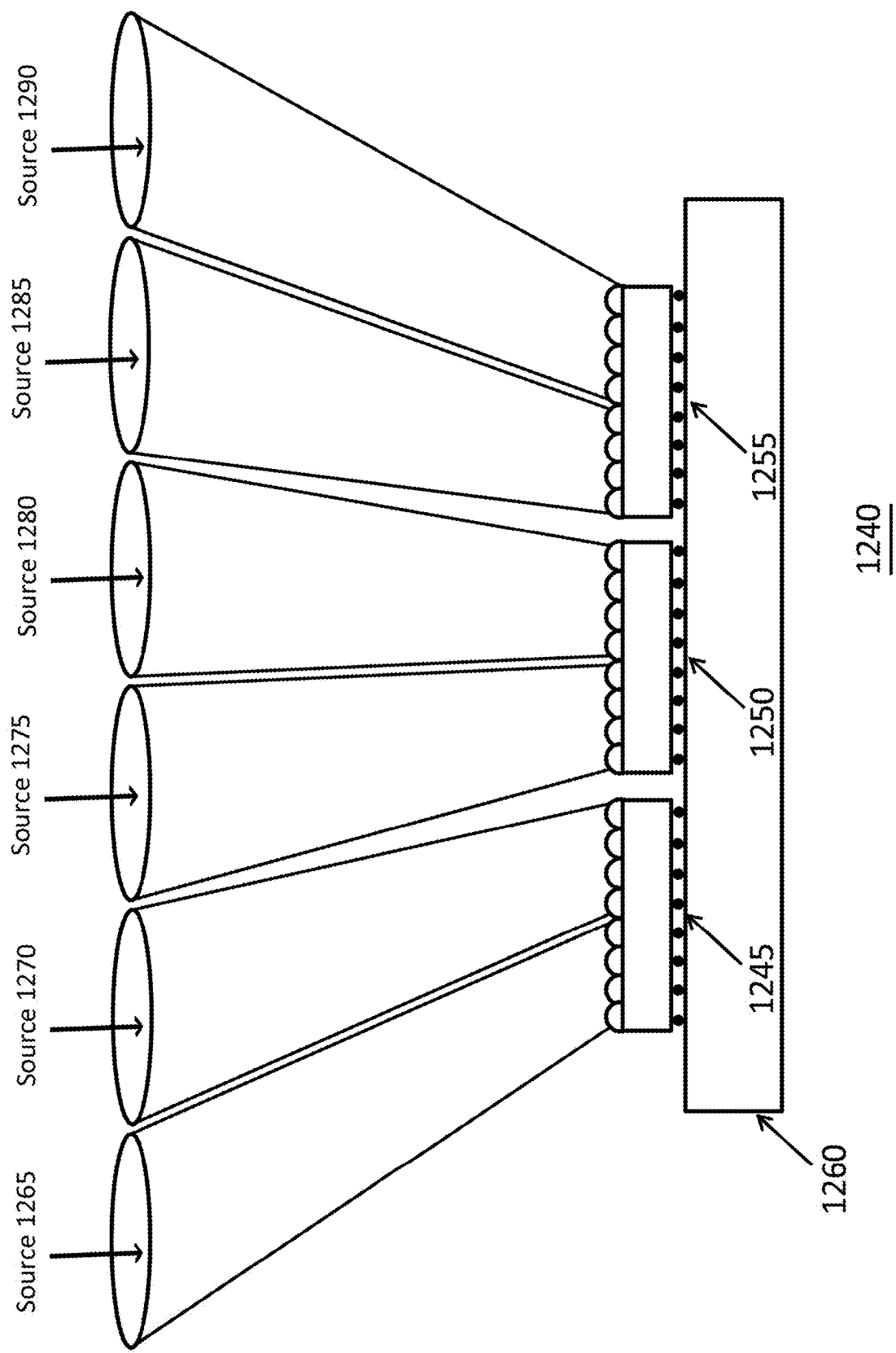
FIG. 12 is a cross-sectional view of the VCSEL array device of FIG. 11, with a corresponding illumination pattern

For situations where higher power from larger laser arrays are required, for longer distance illumination or for illuminating very large fields of view, a multiple substrate approach may be required. FIG. 12 depicts an example multi substrate array 1240. Fabricating larger laser arrays for each beam on a single laser die may be impractical due to cost and yield issues. In an alternative embodiment, multiple laser die 1245, 1250, 1255 are flip-chip bonded to a common submount 1260 that enables separate electrical contact to multiple laser arrays on each die. The laser die have micro-optical elements as described previously, but they can be different for the individual laser die, so that fewer, but larger laser arrays are fabricated on each die. Each die will then form some of the beams 1265, 1270, 1275, 1280, 1285 and 1290 to cover the detector field of view. The combination of beams 1265, 1270, 1275, 1280, 1285 and 1290 from all the laser die can then cover the complete detector field of view. With larger numbers of laser emitters available for each beam, substantially higher powers can be provided for each beam. Each of the die 1245, 1250, 1255 may have an external optical element, such as a lens or diffuser added as described earlier. A single optical element may be added with an aperture large enough for all the die 1245, 1250, 1255 to transmit light through for additional beam forming, matching the detector field of view or for improved eye safety, for example.

While the disclosure above describes the use of microlenses to control the direction and shape of output light of a VCSEL array used as an illumination system for electronic imaging systems or depth (3D) sensing systems. As noted, there is a limit to how far the microlenses in such a system can be offset to provide an off-axis beam direction. This is due to off-axis aberrations of a simple lens system when used in this way and optical losses due to increasing internal reflection from the lenses as offset is increased. An embodiment to a solution to the problem of providing a wide angle field of illumination with the integrated microlens approach described above is to break the illumination task into different sized modules that are then mounted on a prismatic surface that provides the offset angles needed for the combined output of the modules to cover the entire field of illumination.

Figure 13:
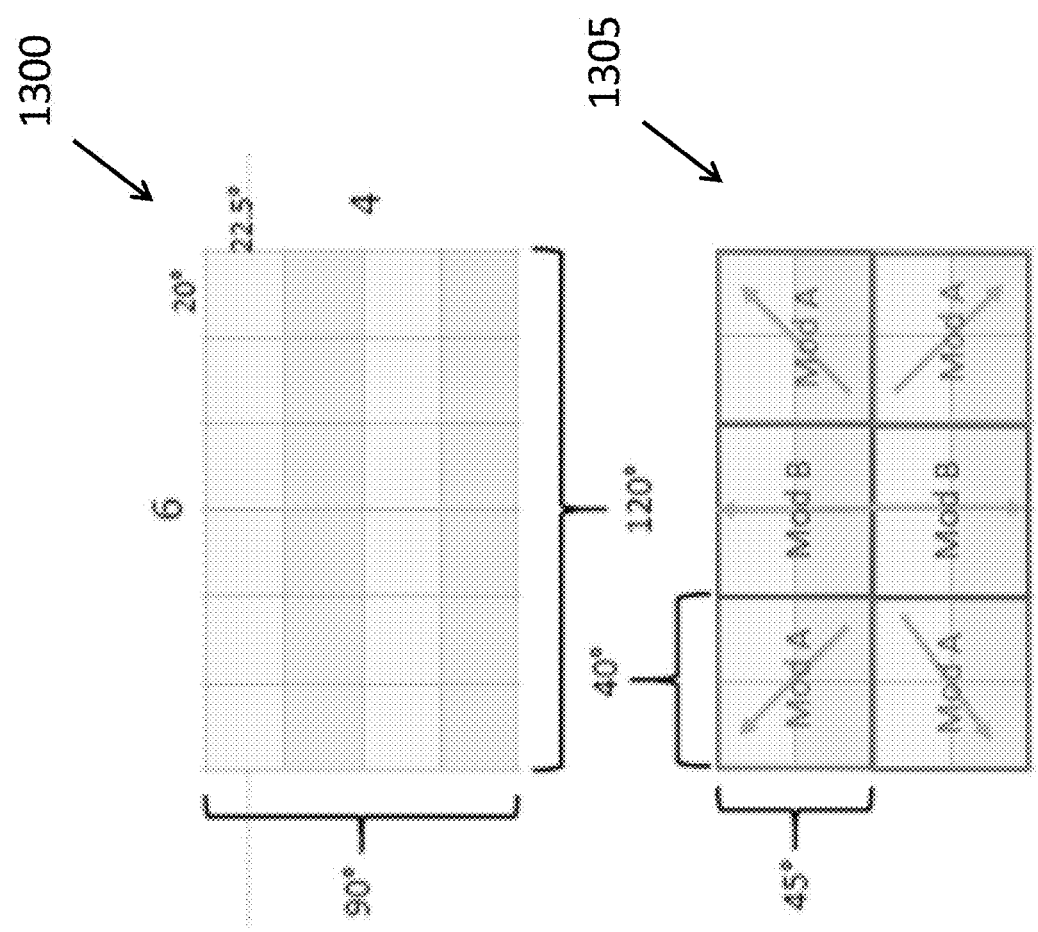
FIG. 13 is an illustration of an example 24-zone optic system comprised of six zones arranged in a rectangular structure.

Accordingly, in an embodiment, a multizone illumination system is disclosed in which each zone addresses a separate section of a combined field of illumination (FOI) and can be controlled by an electronic system so that the zones are turned on in a sequence and with pulse timing that allows efficient use for electronic imaging systems or 3D sensing such as LIDAR or time-of-flight imaging. One exemplary embodiments described herein is a specific example of the solution, but many versions covering different fields of illumination (not necessarily rectangular) with different resolution segments and different segment shapes may be possible. The exemplary embodiment illustrated in FIG. 13 is of a 24-zone design 1300 that includes six modules 1305 of four zones each.

In this embodiment, the FOI may be 120° horizontal and 90° vertical. Each zone may be nominally 20° H×22.5° V. In order to provide overlap, each zone may actually be ~24° H×27° V. The symmetric layout may allow consolidation into the six separate modules 1305. The four addressable zones of each module 1305 may cover a (nominal) 40° H×45° V FOI. Again, to provide overlap, the actual FOI of each module may be ~48° H×52° V. As illustrated, only two unique modules (Module A and Module B) may be needed due to the symmetry of the design. Each module may be a single surface mount VCSEL component that is less than 4 mm×4 mm×2 mm in size (although further layouts are possible). Each module 1305 may be a surface mount compatible substrate with one or more VCSEL arrays flip-chip bonded to the surface of the submount. Alternative versions may be VCSEL arrays directly bonded to the flexible or rigid printed circuit board material. The VCSEL array or arrays may have microlenses etched into the surface of the substrate as otherwise described herein for control of the direction and divergence of the individual VCSELs. The modules 1305 may also have externally applied microlens arrays or may use other micro-optical elements like diffractive structures. The modules 1305 may also have a lid (such as external lens 1220 of FIG. 11), which may include a diffuser to improve eye safety and/or to assist in beam shaping or improving beam uniformity.

Figure 14:
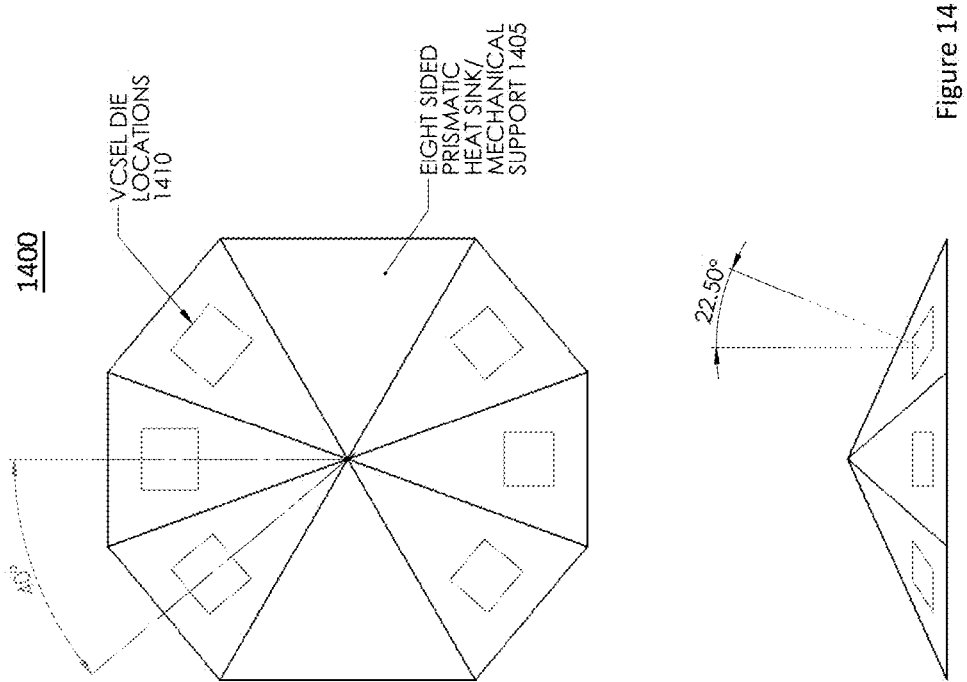
FIG. 14 is an illustration of an example eight-sided prismatic shaped heat sink and mechanical support for a six-module illumination system.

The wide FOI may be realized by mounting the six modules to a raised prismatic heat sink structure that provides the angular offsets for the modules to compensate for their limited angular coverage. The geometry of such a structure is further illustrated in FIG. 14, which shows a top and a side view of imaging system 1400, including an eight-sided prismatic heat sink and mechanical support 1405. The support 1405 creates the geometry needed for six modules to cover the full FOI, each of which can be placed the VCSEL die locations 1410. The prismatic heat sink support 1405 may be machined in aluminum or other suitable materials, such as being molded from high thermal conductivity plastic. While illustrated with a pointed top, the pointed top may be truncated. As with the rectangular structure illustrated in FIG. 13, each zone may be nominally 20° H×22.5° V. In order to provide overlap, each zone may actually be ~24° H×27° V.

Figure 15:
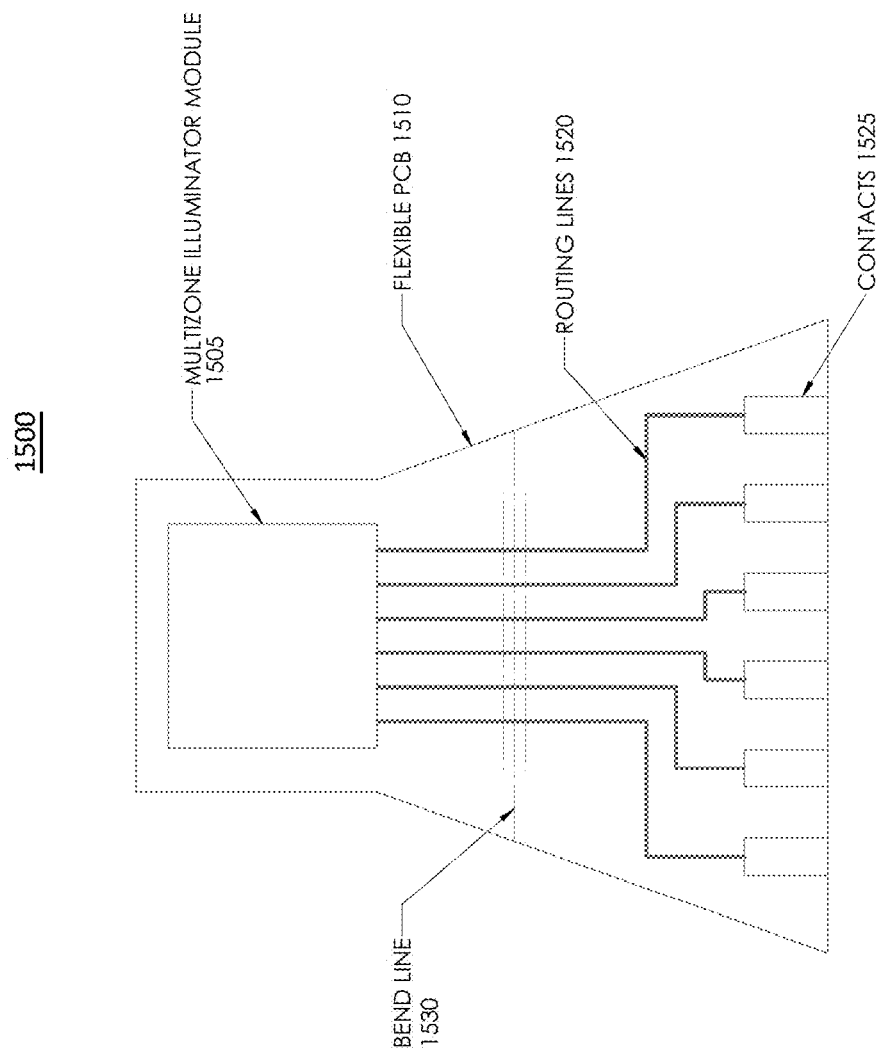
FIG. 15 is an illustration of an example single flexible printed circuit board (PCB) for use in the system of FIG. 14.

As further illustrated below, the modules of the imaging system may be soldered to flexible circuit board material connected to a larger system board. The flexible circuit board segments may then be thermally bonded to the heat sink structure. The total size of the heat sink may be very compact, depending on size of the VCSEL array die used and, in turn, the power required for each zone. FIG. 15 illustrates a single flexible circuit board tab 1500 for one multizone illuminator module 1505 that may be soldered to the flexible PCB 1510. The flexible PCB 1510 includes a routing line 1520 that extends between the contact (not shown) of the module 1505 and the contacts 1525 of the flexible PCB 1510. Bend lines 1530, located at the area where the sloping side of the prismatic heat sink structure 1400 meets the horizontal surface of a rigid PCB as further described below, facilitate the application of the flexible PCB 1500 to the prismatic structure 1400.

Figure 16:
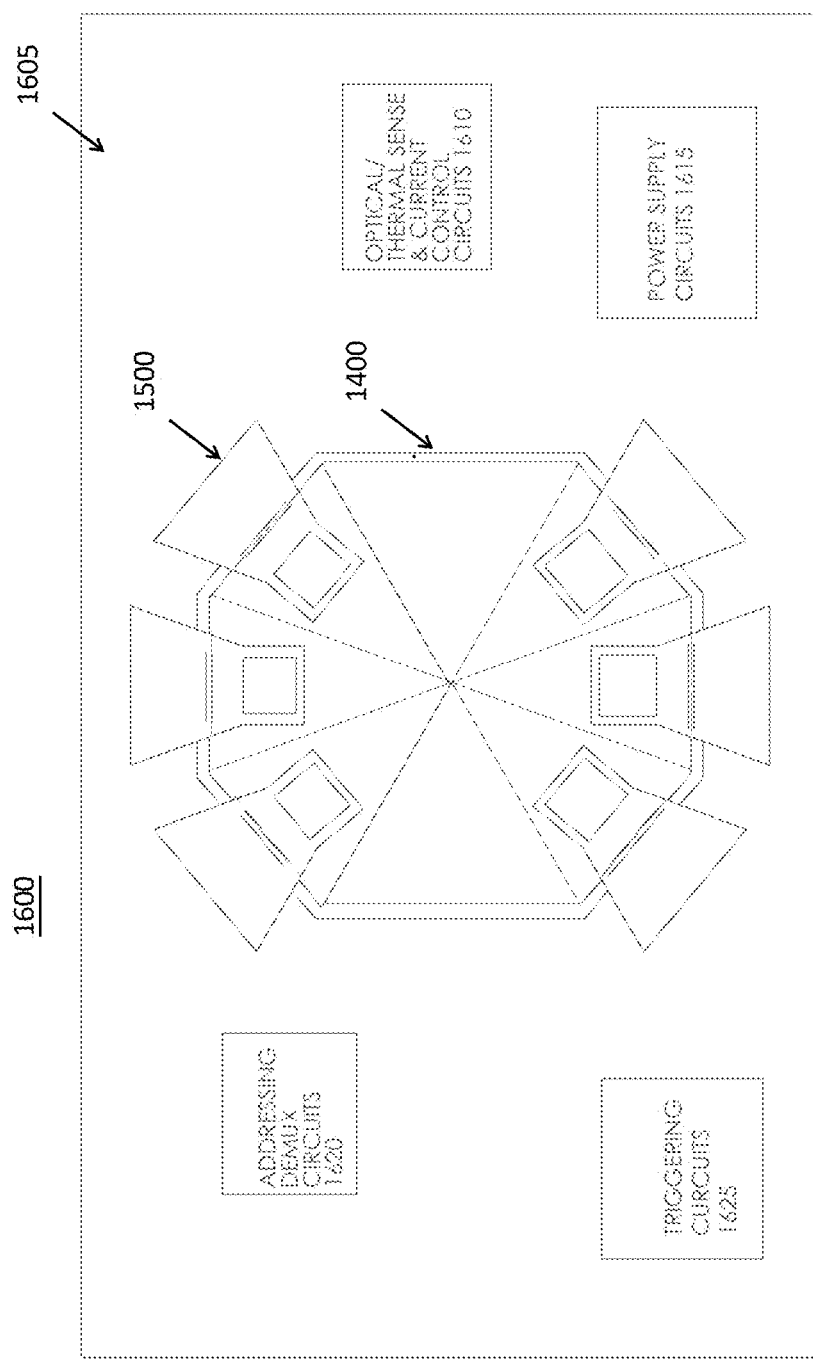
FIG. 16 is an illustration of an example complete system board concept of the illumination system of FIG. 14.

A complete system board design 1600 for the imaging system is shown in FIG. 16. In this embodiment, the flexible printed circuit boards 1500 may be overlaid on the prismatic heat sink structure 1400 to provide the desired angular positioning of the modules. The flexible printed circuit board 1500 may be bonded to the heat sink structure 1400 with thermally conductive adhesive or mechanically bonded to the heat sink. Driver circuits may be located on the individual flexible printed circuit boards 1500 (which may be either multichannel driver integrated circuits or individual FETs). The rigid PCB 1605 may contain other circuitry that does not need to be in close proximity to the laser array modules. For example, the PCB 1605 may include at least an optical/thermal sense and current control circuits 1610, power supply circuits 1615, addressing demux circuits 1620 and triggering circuits 1625.

The embodiment of the system described in FIG. 16 may be sized for approximately 30 W peak optical power output from all of the laser arrays together to cover the FOI. This is about 1.25 W per each of the 24 zones. This embodiment may be configured to the needs of the sensor system with which it is to be used, but much larger or smaller illumination powers may be designed by using larger or smaller laser arrays in the modules. There may also be a need to increase the number of separate addressable zones so that higher total power is available or so that more zones are available to cover the sensor field of view. A diffuser may be added to the top of the module to increase the apparent size of the laser array source, to increase the eye safety tolerance, or to add some blurring to the beam output so as to make the beam profile more uniform.

Another embodiment of a complete system board design is illustrated in FIGS. 17A, 17B and 17C. In this embodiment, an "all in one" flexible PCB assembly 1700 (FIGS. 17A and 17B) lays over the top of the prismatic structure 1705 (FIG. 17C) and makes all of the electrical connections at once. The VCSEL die 1710 of each flexible PCB 1715 is soldered to the flexible PCB assembly 1700. Each flexible PCB 1715 includes a bend line 1720 to better enable the flexibly PCB 1715 to fold up to accommodate the angles of the structure 1705, as shown in FIG. 17B. A thermal past may be used to hold the flexible PCBs 1715 to the prismatic structure 1705.

In an embodiment, a wide-angle illuminator module comprises a rigid support structure having a plurality of angled faces, a flexible circuit including one or more VCSEL arrays, each VCSEL array positioned over a face among the plurality of angled faces, each VCSEL array including a plurality of integrated microlenses with one microlens positioned over each VCSEL in the VCSEL array, and a driver circuit for providing electrical pulses to each VCSEL array, wherein the plurality of VCSEL arrays address illumination zones in a combined field of illumination. In the embodiment, wherein the plurality of angled faces are symmetrically arranged around a top surface of the rigid support structure.

In the embodiment, wherein the plurality of angled faces of the rigid support structure is prismatic. In the embodiment, wherein each VCSEL array corresponds to a single flexible circuit, wherein the prismatic support structure has eight opposing faces, wherein two opposing faces are blank, and wherein one flexible circuit is positioned over each of six opposing faces. In the embodiment, wherein the VCSEL array of each flexible circuit includes a plurality of VCSELs arranged in four areas arranged in a square shape with each area corresponding to each illumination zone, and wherein each illumination zone nominally covers a 20 degree horizontal by 22.5 degree vertical field of illumination. In the embodiment, wherein the flexible circuit includes a plurality of VCSEL arrays, each VCSEL array configured to be positioned over a corresponding angled face of the prismatic rigid support structure so that the resulting combined field of illumination generated by optical beams of the plurality of VCSEL arrays is wide.

In the embodiment, wherein the plurality of angled faces of the rigid support structure is rectangular. In the embodiment, wherein each VCSEL array corresponds to a single flexible circuit, wherein the rectangular support structure has six opposing faces, and wherein one flexible circuit is positioned over each of six opposing faces. In the embodiment, wherein the VCSEL array of each flexible circuit includes a plurality of VCSELs arranged in four area zones arranged in a square shape with each area corresponding to each illumination zone, and wherein each illumination zone nominally covers 20 degree horizontally by 22.5 degrees vertically of the combined field of illumination. In the embodiment, wherein the flexible circuit includes a plurality of VCSEL arrays, each VCSEL array configured to be positioned over a corresponding angled face of the rectangular rigid support structure so that the resulting combined field of illumination generated by optical beams of the plurality of VCSEL arrays is wide.

In the embodiment, wherein one or more microlenses among the plurality of integrated microlenses are offset relative to an optical axes of a corresponding VCSEL so as to tilt an output beam of light to one or more of shape of the combined field of illumination, provide a desired level of irradiance to one illumination zone of the combined field of illumination, provide a desired output beam of light distribution, and provide an desired level of uniformity across the one illumination zone.

In the embodiment, wherein the rigid support structure is a thermal heatsink. In the embodiment, further comprising a rigid circuit board including additional circuitry for controlling and powering the plurality of VCSEL arrays, wherein a first portion of each flexible circuit is surface mount soldered to the rigid circuit board to create a low parasitic electrical circuit connection and wherein a second portion of each flexible circuit including each VCSEL array is connected to the face support structure so as to allow for thermal contact between the VCSEL array and the thermal heatsink.

In the embodiment, wherein the plurality of angled faces of the rigid support structure is prismatic with a truncated top. In the embodiment, wherein the prismatic support structure has eight opposing faces, wherein two opposing faces are blank, and wherein the flexible circuit is positioned over the prismatic support structure so one VCSEL array is positioned over each of six opposing faces. In the embodiment, wherein each VCSEL array includes a plurality of VCSELs arranged in four areas arranged in a square shape with each area corresponding to each illumination zone, and wherein each illumination zone nominally covers a 20 degree horizontal by 22.5 degree vertical field of illumination. In the embodiment, wherein the flexible circuit includes a plurality of VCSEL arrays, each VCSEL array configured to be positioned over a corresponding angled face of the truncated prismatic rigid support structure so that the resulting combined field of illumination generated by optical beams of the plurality of VCSEL arrays is wide.

In the embodiment, wherein each VCSEL array corresponds to one face among the plurality of faces of the support structure, wherein each VCSEL array includes a plurality of VCSELs arranged in four areas arranged in a square shape with each area corresponding to each illumination zone, herein one or more microlenses among the plurality of integrated microlenses are offset relative to an optical axes of a corresponding VCSEL so as to tilt an output beam of light to shape the illumination zone. In the embodiment, wherein a first VCSEL array has a set of integrated microlenses offset to form a first shape of the illumination zone and a second VCSEL array has a set of integrated microlenses offset to form a second shape of the illumination zone, and wherein the first VCSEL arrays on opposing sides of the support structure are turned 180 degrees relative to each other, and the second VCSEL arrays on opposing sides of the support structure are turned 180 degrees relative to each other.

While the present disclosure has been illustrated and described herein in terms of several alternatives, it is to be understood that the techniques described herein can have a multitude of additional uses and applications. Accordingly, the disclosure should not be limited to just the particular description, embodiments and various drawing figures contained in this specification that merely illustrate one or more embodiments, alternatives and application of the principles of the disclosure.

What is claimed:

1. A wide-angle illuminator module, comprising:
    a rigid support structure having a plurality of angled faces;
    a plurality of vertical-cavity surface-emitting laser (VCSEL) arrays configured to provide a full azimuthal field of illumination around the rigid support structure at one time,
        wherein each VCSEL array, of the plurality of VCSEL arrays, is positioned over a face of the plurality of angled faces to project light outward from the face, and
        wherein each VCSEL array, of the plurality of VCSEL arrays, includes a plurality of integrated microlenses with one microlens positioned over each VCSEL in the VCSEL array;
    a flexible circuit including one or more VCSEL arrays of the plurality of VCSEL arrays; and
    a driver circuit for providing electrical pulses to the plurality of VCSEL arrays.

2. The wide-angle illuminator module of claim 1, wherein the plurality of angled faces are symmetrically arranged around a top surface of the rigid support structure.

3. The wide-angle illuminator module of claim 1, wherein the plurality of angled faces are prismatic.

4. The wide-angle illuminator module of claim 3, further comprising:
    a plurality of flexible circuits including the flexible circuit,
        wherein each VCSEL array, of the plurality of VCSEL arrays, corresponds to a single flexible circuit of the plurality of flexible circuits,
        wherein the rigid support structure has eight opposing faces,
        wherein two opposing faces, of the eight opposing faces, are blank, and
        wherein one flexible circuit, of the plurality of flexible circuits, is positioned over each of six opposing faces of the eight opposing faces.

5. The wide-angle illuminator module of claim 4, wherein each VCSEL array, of the plurality of VCSEL arrays, includes a plurality of VCSELs arranged in four areas arranged in a square shape with each area, of the four areas, corresponding to an illumination zone, and
    wherein each corresponding illumination zone nominally covers a 20 degree horizontal by 22.5 degree vertical field of illumination.

6. The wide-angle illuminator module of claim 1, wherein the plurality of angled faces are rectangular.

7. The wide-angle illuminator module of claim 6, further comprising:
a plurality of flexible circuits including the flexible circuit,
wherein the rigid support structure has six opposing faces, and
wherein one flexible circuit, of the plurality of flexible circuits, is positioned over each of the six opposing faces.

8. The wide-angle illuminator module of claim 7, wherein each VCSEL array, of the plurality of VCSEL arrays, includes a plurality of VCSELs arranged in four area zones arranged in a square shape with each area zone of the four area zones, corresponding to an illumination zone, and
wherein each corresponding illumination zone nominally covers 20 degree horizontally by 22.5 degrees vertically of the full azimuthal field of illumination.

9. The wide-angle illuminator module of claim 1, wherein one or more microlenses of the plurality of integrated microlenses are offset relative to an optical axis of a corresponding VCSEL so as to tilt an output beam of light to one or more of:
shape of the full azimuthal field of illumination,
provide a desired level of irradiance to one illumination zone of the full azimuthal field of illumination,
provide a desired output beam of light distribution, or
provide a desired level of uniformity across the one illumination zone.

10. The wide-angle illuminator module of claim 1, wherein the rigid support structure is a thermal heatsink.

11. The wide-angle illuminator module of claim 10, further comprising:
a rigid circuit board including additional circuitry for controlling and powering the plurality of VCSEL arrays,
wherein a first portion of the flexible circuit is surface mount soldered to the rigid circuit board to create a low parasitic electrical circuit connection, and
wherein one or more second portions of the flexible circuit that includes the one or more VCSEL arrays is connected to the rigid support structure so as to allow for thermal contact between the one or more VCSEL arrays and the thermal heatsink.

12. The wide-angle illuminator module of claim 1, wherein the rigid support structure is a prismatic support structure with a truncated top.

13. The wide-angle illuminator module of claim 12, wherein the prismatic support structure has eight opposing faces,
wherein two opposing faces, of the eight opposing faces, are blank, and
wherein the flexible circuit is positioned over the prismatic support structure so that one VCSEL array, of the plurality of VCSEL arrays, is positioned over each of six opposing faces of the eight opposing faces.

14. The wide-angle illuminator module of claim 13, wherein each VCSEL array, of the plurality of VCSEL arrays, includes a plurality of VCSELs arranged in four areas arranged in a square shape with each area, of the four areas, corresponding to an illumination zone, and
wherein each corresponding illumination zone nominally covers a 20 degree horizontal by 22.5 degree vertical field of illumination.

15. The wide-angle illuminator module of claim 1,
wherein one or more microlenses of the plurality of integrated microlenses are offset relative to an optical axis of a corresponding VCSEL so as to tilt an output beam of light to shape the full azimuthal field of illumination.

16. The wide-angle illuminator module of claim 15, wherein the flexible circuit includes at least two VCSEL arrays of a first type and at least two VCSEL arrays of a second type,
the at least two VSCEL arrays of the first type having a set of integrated microlenses offset to form a first shape of the full azimuthal field of illumination, and
the at least two VSCEL arrays of the second type having a set of integrated microlenses offset to form a second shape of the full azimuthal field of illumination,
wherein the at least two VCSEL arrays of the first type are arranged on opposing sides of the rigid support structure and are turned 180 degrees relative to each other, and
wherein the at least two VCSEL arrays of the second type are arranged on opposing sides of the rigid support structure and are turned 180 degrees relative to each other.

17. The wide-angle illuminator module of claim 1, further comprising:
a flexible circuit board assembly that includes the flexible circuit,
wherein the flexible circuit includes the plurality of VCSEL arrays.

18. The wide-angle illuminator module of claim 1, further comprising:
a plurality of flexible circuit boards,
wherein a flexible circuit board, of the plurality of flexible circuit board, includes the flexible circuit.

19. The wide-angle illuminator module of claim 1, further comprising:
a flexible circuit board that includes:
the flexible circuit, and
a bend line that enables the flexible circuit board to fold.

20. The wide-angle illuminator module of claim 1, wherein the full azimuthal field of illumination comprises a plurality of illumination zones,
wherein each illumination zone, of the plurality of illumination zones, correspond to a VCSEL array of the plurality of VCSEL arrays, and
wherein two or more illumination zones, of the plurality of illumination zones, overlap.

* * * * *

UNITED STATES PATENT AND TRADEMARK OFFICE
CERTIFICATE OF CORRECTION

PATENT NO. : 11,095,365 B2  
APPLICATION NO. : 16/406846  
DATED : August 17, 2021  
INVENTOR(S) : Preethi Dacha et al.

Page 1 of 1

It is certified that error appears in the above-identified patent and that said Letters Patent is hereby corrected as shown below:

In the Claims

Claim 8:
Column 15, Line 13, change "square shape with each area zone of the four" to -- square shape with each area zone, of the four --

Signed and Sealed this  
Eighteenth Day of January, 2022

Drew Hirshfeld  
*Performing the Functions and Duties of the*  
*Under Secretary of Commerce for Intellectual Property and*  
*Director of the United States Patent and Trademark Office*